United States Patent
Haig et al.

(10) Patent No.: US 11,409,528 B2
(45) Date of Patent: Aug. 9, 2022

(54) ORTHOGONAL DATA TRANSPOSITION SYSTEM AND METHOD DURING DATA TRANSFERS TO/FROM A PROCESSING ARRAY

(71) Applicant: GSI Technology, Inc., Sunnyvale, CA (US)

(72) Inventors: Bob Haig, Sunnyvale, CA (US); Patrick Chuang, Sunnyvale, CA (US); Chih Tseng, Sunnyvale, CA (US); Mu-Hsiang Huang, Sunnyvale, CA (US)

(73) Assignee: GSI Technology, Inc., Sunnyvale, CA (US)

( * ) Notice: Subject to any disclaimer, the term of this patent is extended or adjusted under 35 U.S.C. 154(b) by 58 days.

(21) Appl. No.: 17/082,914

(22) Filed: Oct. 28, 2020

(65) Prior Publication Data
US 2021/0173647 A1   Jun. 10, 2021

Related U.S. Application Data

(60) Division of application No. 16/150,176, filed on Oct. 2, 2018, now Pat. No. 10,860,320, which is a
(Continued)

(51) Int. Cl.
*G11C 5/06* (2006.01)
*G06F 9/30* (2018.01)
(Continued)

(52) U.S. Cl.
CPC ...... *G06F 9/30043* (2013.01); *G06F 9/30029* (2013.01); *G06F 15/785* (2013.01);
(Continued)

(58) Field of Classification Search
CPC ... G11C 11/412; G11C 11/418; G11C 11/419; G06F 9/30043; G06F 9/30029; G06F 15/785
(Continued)

(56) References Cited

U.S. PATENT DOCUMENTS 3,451,694 A   6/1969  Hass
3,747,952 A   7/1973  Graebe
(Continued)

FOREIGN PATENT DOCUMENTS

CN   10475243 B    1/2019
DE   10133281 A1   1/2002
(Continued)

OTHER PUBLICATIONS

US 10,564,982 B1, 02/2020, Oh et al. (withdrawn)
(Continued)

*Primary Examiner* — Viet Q Nguyen
(74) *Attorney, Agent, or Firm* — DLA Piper LLP US

(57) ABSTRACT

A device and method for facilitating orthogonal data transposition during data transfers to/from a processing array and a storage memory since the data words processed by the processing array (using computational memory cells) are stored orthogonally to how the data words are stored in storage memory. Thus, when data words are transferred between storage memory and the processing array, a mechanism orthogonally transposes the data words.

36 Claims, 26 Drawing Sheets

Related U.S. Application Data continuation-in-part of application No. 15/709,399, filed on Sep. 19, 2017, now Pat. No. 10,998,040, application No. 17/082,914, filed on Oct. 28, 2020, which is a continuation-in-part of application No. 15/709,401, filed on Sep. 19, 2017, now Pat. No. 10,249,362, and a continuation-in-part of application No. 15/709,379, filed on Sep. 19, 2017, now Pat. No. 10,521,229, and a continuation-in-part of application No. 15/709,382, filed on Sep. 19, 2017, now Pat. No. 10,725,777, and a continuation-in-part of application No. 15/709,385, filed on Sep. 19, 2017, now Pat. No. 10,860,318.

(60) Provisional application No. 62/430,767, filed on Dec. 6, 2016, provisional application No. 62/430,762, filed on Dec. 6, 2016.

(51) Int. Cl.
| | | |
|---|---|---|
| *G11C 11/419* | (2006.01) | |
| *G06F 15/78* | (2006.01) | |
| *G11C 11/412* | (2006.01) | |
| *G11C 11/418* | (2006.01) | |

(52) U.S. Cl.
CPC .......... *G11C 11/412* (2013.01); *G11C 11/418* (2013.01); *G11C 11/419* (2013.01)

(58) Field of Classification Search
USPC .............................................. 365/63, 189.08
See application file for complete search history.

(56) References Cited

U.S. PATENT DOCUMENTS

| | | | |
|---|---|---|---|
| 3,795,412 A | 3/1974 | John | |
| 4,227,717 A | 10/1980 | Bouvier | |
| 4,308,505 A | 12/1981 | Messerschmitt | |
| 4,587,496 A | 5/1986 | Wolaver | |
| 4,594,564 A | 6/1986 | Yarborough, Jr. | |
| 4,677,394 A | 6/1987 | Vollmer | |
| 4,716,322 A | 12/1987 | DArrigo et al. | |
| 4,741,006 A | 4/1988 | Yamaguchi et al. | |
| 4,856,035 A | 8/1989 | Lewis | |
| 5,008,636 A | 4/1991 | Markinson | |
| 5,302,916 A | 4/1994 | Pritchett | |
| 5,375,089 A | 12/1994 | Lo | |
| 5,382,922 A | 1/1995 | Gersbach et al. | |
| 5,400,274 A | 3/1995 | Jones et al. | |
| 5,473,574 A | 12/1995 | Clemen et al. | |
| 5,530,383 A | 6/1996 | May | |
| 5,535,159 A | 7/1996 | Nii | |
| 5,563,834 A | 10/1996 | Longway et al. | |
| 5,587,672 A | 12/1996 | Ranganathan et al. | |
| 5,608,354 A | 3/1997 | Hori | |
| 5,661,419 A | 8/1997 | Bhagwan | |
| 5,696,468 A | 12/1997 | Nise | |
| 5,736,872 A | 4/1998 | Sharma et al. | |
| 5,744,979 A | 4/1998 | Goetting | |
| 5,744,991 A | 4/1998 | Jefferson et al. | |
| 5,748,044 A | 5/1998 | Xue | |
| 5,768,559 A | 6/1998 | Iino et al. | |
| 5,805,912 A | 9/1998 | Johnson et al. | |
| 5,883,853 A | 3/1999 | Zheng et al. | |
| 5,937,204 A | 8/1999 | Schinnerer | |
| 5,942,949 A | 8/1999 | Wilson et al. | |
| 5,963,059 A | 10/1999 | Partovi et al. | |
| 5,969,576 A | 10/1999 | Trodden | |
| 5,969,986 A | 10/1999 | Wong | |
| 5,977,801 A | 11/1999 | Boerstler | |
| 5,999,458 A | 12/1999 | Nishimura et al. | |
| 6,005,794 A | 12/1999 | Sheffield et al. | |
| 6,044,034 A | 3/2000 | Katakura | |
| 6,058,063 A | 5/2000 | Jang | |
| 6,072,741 A | 6/2000 | Taylor | |
| 6,100,721 A | 8/2000 | Durec et al. | |
| 6,100,736 A | 8/2000 | Wu et al. | |
| 6,114,920 A | 9/2000 | Moon et al. | |
| 6,115,320 A | 9/2000 | Mick et al. | |
| 6,133,770 A | 10/2000 | Hasegawa | |
| 6,167,487 A | 12/2000 | Camacho | |
| 6,175,282 B1 | 1/2001 | Yasuda | |
| 6,226,217 B1 | 5/2001 | Riedlinger et al. | |
| 6,262,937 B1 | 7/2001 | Arcoleo et al. | |
| 6,263,452 B1 | 7/2001 | Jewett et al. | |
| 6,265,902 B1 | 7/2001 | Klemmer et al. | |
| 6,286,077 B1 | 9/2001 | Choi et al. | |
| 6,310,880 B1 | 10/2001 | Waller | |
| 6,366,524 B1 | 4/2002 | Abedifard | |
| 6,377,127 B1 | 4/2002 | Fukaishi et al. | |
| 6,381,684 B1 | 4/2002 | Hronik et al. | |
| 6,385,122 B1 | 5/2002 | Chang | |
| 6,407,642 B2 | 6/2002 | Dosho et al. | |
| 6,418,077 B1 | 7/2002 | Naven | |
| 6,441,691 B1 | 8/2002 | Jones et al. | |
| 6,448,757 B2 | 9/2002 | Hill | |
| 6,473,334 B1 | 10/2002 | Bailey et al. | |
| 6,483,361 B1 | 11/2002 | Chiu | |
| 6,504,417 B1 | 1/2003 | Cecchi et al. | |
| 6,538,475 B1 | 3/2003 | Johansen et al. | |
| 6,567,338 B1 | 5/2003 | Mick | |
| 6,594,194 B2 | 7/2003 | Gold | |
| 6,642,747 B1 | 11/2003 | Chiu | |
| 6,661,267 B2 | 12/2003 | Walker et al. | |
| 6,665,222 B2 | 12/2003 | Wright et al. | |
| 6,683,502 B1 | 1/2004 | Groen et al. | |
| 6,683,930 B1 | 1/2004 | Dalmia | |
| 6,732,247 B2 | 5/2004 | Berg et al. | |
| 6,744,277 B1 | 6/2004 | Chang et al. | |
| 6,757,854 B1 | 6/2004 | Zhao et al. | |
| 6,789,209 B1 | 9/2004 | Suzuki et al. | |
| 6,816,019 B2 | 11/2004 | Delbo' et al. | |
| 6,836,419 B2 | 12/2004 | Loughmiller | |
| 6,838,951 B1 | 1/2005 | Nieri et al. | |
| 6,842,396 B2 | 1/2005 | Kono | |
| 6,853,696 B1 | 2/2005 | Moser et al. | |
| 6,854,059 B2 | 2/2005 | Gardner | |
| 6,856,202 B2 | 2/2005 | Lesso | |
| 6,859,107 B1 | 2/2005 | Moon et al. | |
| 6,882,237 B2 | 4/2005 | Singh et al. | |
| 6,897,696 B2 | 5/2005 | Chang et al. | |
| 6,933,789 B2 | 8/2005 | Molnar et al. | |
| 6,938,142 B2 | 8/2005 | Pawlowski | |
| 6,940,328 B2 | 9/2005 | Lin | |
| 6,954,091 B2 | 10/2005 | Wurzer | |
| 6,975,554 B1 | 12/2005 | Lapidus et al. | |
| 6,998,922 B2 | 2/2006 | Jensen et al. | |
| 7,002,404 B2 | 2/2006 | Gaggl et al. | |
| 7,002,416 B2 | 2/2006 | Pettersen et al. | |
| 7,003,065 B2 | 2/2006 | Homol et al. | |
| 7,017,090 B2 | 3/2006 | Endou et al. | |
| 7,019,569 B2 | 3/2006 | Fan-Jiang | |
| 7,042,271 B2 | 5/2006 | Chung et al. | |
| 7,042,792 B2 | 5/2006 | Lee et al. | |
| 7,042,793 B2 * | 5/2006 | Masuo ..................... | G11C 8/16 365/230.01 |
| 7,046,093 B1 | 5/2006 | McDonagh et al. | |
| 7,047,146 B2 | 5/2006 | Chuang et al. | |
| 7,053,666 B2 | 5/2006 | Tak et al. | |
| 7,095,287 B2 | 8/2006 | Maxim et al. | |
| 7,099,643 B2 | 8/2006 | Lin | |
| 7,141,961 B2 | 11/2006 | Hirayama et al. | |
| 7,142,477 B1 | 11/2006 | Tran et al. | |
| 7,152,009 B2 | 12/2006 | Bokui et al. | |
| 7,180,816 B2 | 2/2007 | Park | |
| 7,200,713 B2 | 4/2007 | Cabot et al. | |
| 7,218,157 B2 | 5/2007 | Van De Beek et al. | |
| 7,233,214 B2 | 6/2007 | Kim et al. | |
| 7,246,215 B2 | 7/2007 | Lu et al. | |
| 7,263,152 B2 | 8/2007 | Miller et al. | |
| 7,269,402 B2 | 9/2007 | Uozumi et al. | |
| 7,282,999 B2 | 10/2007 | Da Dalt et al. | |
| 7,312,629 B2 | 12/2007 | Chuang et al. | |

(56) References Cited

U.S. PATENT DOCUMENTS

| | | |
|---|---|---|
| 7,313,040 B2 | 12/2007 | Chuang et al. |
| 7,330,080 B1 | 2/2008 | Stoiber et al. |
| 7,340,577 B1 | 3/2008 | Van Dyke et al. |
| 7,349,515 B1 | 3/2008 | Chew et al. |
| 7,352,249 B2 | 4/2008 | Balboni et al. |
| 7,355,482 B2 | 4/2008 | Meltzer |
| 7,355,907 B2 | 4/2008 | Chen et al. |
| 7,369,000 B2 | 5/2008 | Wu et al. |
| 7,375,593 B2 | 5/2008 | Self |
| 7,389,457 B2 | 6/2008 | Chen et al. |
| 7,439,816 B1 | 10/2008 | Lombaard |
| 7,463,101 B2 | 12/2008 | Tung |
| 7,464,282 B1 | 12/2008 | Abdollahi-Alibeik et al. |
| 7,487,315 B2 | 2/2009 | Hur et al. |
| 7,489,164 B2 | 2/2009 | Madurawe |
| 7,512,033 B2 | 3/2009 | Hur et al. |
| 7,516,385 B2 | 4/2009 | Chen et al. |
| 7,538,623 B2 | 5/2009 | Jensen et al. |
| 7,545,223 B2 | 6/2009 | Watanabe |
| 7,565,480 B2 | 7/2009 | Ware et al. |
| 7,577,225 B2 | 8/2009 | Azadet et al. |
| 7,592,847 B2 | 9/2009 | Liu et al. |
| 7,595,657 B2 | 9/2009 | Chuang et al. |
| 7,622,996 B2 | 11/2009 | Liu |
| 7,630,230 B2 | 12/2009 | Wong |
| 7,633,322 B1 | 12/2009 | Zhuang et al. |
| 7,635,988 B2 | 12/2009 | Madurawe |
| 7,646,215 B2 | 1/2010 | Chuang et al. |
| 7,646,648 B2 | 1/2010 | Arsovski |
| 7,659,783 B2 | 2/2010 | Tai |
| 7,660,149 B2 * | 2/2010 | Liaw ............... G11C 11/412 365/154 |
| 7,663,415 B2 | 2/2010 | Chatterjee et al. |
| 7,667,678 B2 | 2/2010 | Guttag |
| 7,675,331 B2 | 3/2010 | Jung et al. |
| 7,719,329 B1 | 5/2010 | Smith et al. |
| 7,719,330 B2 | 5/2010 | Lin et al. |
| 7,728,675 B1 | 6/2010 | Kennedy et al. |
| 7,737,743 B1 | 6/2010 | Gao et al. |
| 7,746,181 B1 | 6/2010 | Moyal |
| 7,746,182 B2 | 6/2010 | Ramaswamy et al. |
| 7,750,683 B2 | 7/2010 | Huang et al. |
| 7,760,032 B2 | 7/2010 | Ardehali |
| 7,760,040 B2 | 7/2010 | Zhang et al. |
| 7,760,532 B2 | 7/2010 | Shirley et al. |
| 7,782,655 B2 | 8/2010 | Shau |
| 7,812,644 B2 | 10/2010 | Cha et al. |
| 7,813,161 B2 | 10/2010 | Luthra |
| 7,830,212 B2 | 11/2010 | Lee et al. |
| 7,839,177 B1 | 11/2010 | Soh |
| 7,843,239 B2 | 11/2010 | Sohn et al. |
| 7,843,721 B1 | 11/2010 | Chou et al. |
| 7,848,725 B2 | 12/2010 | Zolfaghari et al. |
| 7,859,919 B2 | 12/2010 | De La Cruz, II et al. |
| 7,876,163 B2 | 1/2011 | Hachigo |
| 7,916,554 B2 | 3/2011 | Pawlowski |
| 7,920,409 B1 | 4/2011 | Clark et al. |
| 7,920,665 B1 | 4/2011 | Lombaard |
| 7,924,599 B1 | 4/2011 | Evans, Jr. et al. |
| 7,940,088 B1 | 5/2011 | Sampath et al. |
| 7,944,256 B2 | 5/2011 | Masuda |
| 7,956,695 B1 | 6/2011 | Ding et al. |
| 7,965,108 B2 | 6/2011 | Liu et al. |
| 8,004,920 B2 | 8/2011 | Ito et al. |
| 8,008,956 B1 | 8/2011 | Shin et al. |
| 8,044,724 B2 | 10/2011 | Rao et al. |
| 8,063,707 B2 | 11/2011 | Wang |
| 8,087,690 B2 | 1/2012 | Kim |
| 8,089,819 B1 | 1/2012 | Noda et al. |
| 8,117,567 B2 | 2/2012 | Arsovski |
| 8,174,332 B1 | 5/2012 | Lombaard et al. |
| 8,218,707 B2 | 7/2012 | Mai |
| 8,242,820 B2 | 8/2012 | Kim |
| 8,258,831 B1 | 9/2012 | Banai et al. |
| 8,284,593 B2 | 10/2012 | Russell et al. |
| 8,294,502 B2 | 10/2012 | Lewis et al. |
| 8,400,200 B1 | 3/2013 | Kim et al. |
| 8,488,408 B1 | 7/2013 | Shu et al. |
| 8,493,774 B2 * | 7/2013 | Kuang ................ G11C 7/1006 326/121 |
| 8,526,256 B2 * | 9/2013 | Ghosh ................ G11C 7/067 365/203 |
| 8,542,050 B2 | 9/2013 | Chuang et al. |
| 8,575,982 B1 | 11/2013 | Shu et al. |
| 8,593,860 B2 | 11/2013 | Shu et al. |
| 8,625,334 B2 | 1/2014 | Liaw |
| 8,643,418 B2 | 2/2014 | Ma et al. |
| 8,692,621 B2 | 4/2014 | Snowden et al. |
| 8,693,236 B2 * | 4/2014 | Shu ................ G11C 11/419 365/207 |
| 8,817,550 B1 | 8/2014 | Oh |
| 8,837,207 B1 | 9/2014 | Jou et al. |
| 8,885,439 B1 | 11/2014 | Shu et al. |
| 8,971,096 B2 | 3/2015 | Jung et al. |
| 8,982,649 B2 | 3/2015 | Shu et al. |
| 8,995,162 B2 * | 3/2015 | Sang ................ G11C 11/4125 365/72 |
| 9,018,992 B1 | 4/2015 | Shu et al. |
| 9,030,893 B2 | 5/2015 | Jung et al. |
| 9,053,768 B2 | 6/2015 | Shu et al. |
| 9,059,691 B2 | 6/2015 | Lin |
| 9,070,477 B1 | 6/2015 | Clark |
| 9,083,356 B1 | 7/2015 | Cheng |
| 9,093,135 B2 | 7/2015 | Khailany et al. |
| 9,094,025 B1 | 7/2015 | Cheng |
| 9,135,986 B2 | 9/2015 | Shu et al. |
| 9,142,285 B2 | 9/2015 | Hwang et al. |
| 9,159,391 B1 | 10/2015 | Shu et al. |
| 9,171,634 B2 * | 10/2015 | Zheng ................ G11C 16/28 |
| 9,177,646 B2 | 11/2015 | Arsovski |
| 9,196,324 B2 | 11/2015 | Haig et al. |
| 9,240,229 B1 | 1/2016 | Oh et al. |
| 9,311,971 B1 | 4/2016 | Oh |
| 9,318,174 B1 | 4/2016 | Chuang et al. |
| 9,356,611 B1 | 5/2016 | Shu et al. |
| 9,384,822 B2 | 7/2016 | Shu et al. |
| 9,385,032 B2 | 7/2016 | Shu |
| 9,396,790 B1 | 7/2016 | Chhabra et al. |
| 9,396,795 B1 | 7/2016 | Jeloka et al. |
| 9,401,200 B1 | 7/2016 | Chan et al. |
| 9,412,440 B1 | 8/2016 | Shu et al. |
| 9,413,295 B1 | 8/2016 | Chang |
| 9,431,079 B1 | 8/2016 | Shu et al. |
| 9,443,575 B2 * | 9/2016 | Yabuuchi .............. G11C 11/418 |
| 9,484,076 B1 | 11/2016 | Shu et al. |
| 9,494,647 B1 | 11/2016 | Chuang et al. |
| 9,552,872 B2 | 1/2017 | Jung et al. |
| 9,608,651 B1 | 3/2017 | Cheng |
| 9,613,670 B2 | 4/2017 | Chuang et al. |
| 9,613,684 B2 | 4/2017 | Shu et al. |
| 9,640,540 B1 * | 5/2017 | Liaw .................. H01L 28/00 |
| 9,679,631 B2 | 6/2017 | Haig et al. |
| 9,685,210 B1 | 6/2017 | Ghosh et al. |
| 9,692,429 B1 | 6/2017 | Chang et al. |
| 9,697,890 B1 | 7/2017 | Wang |
| 9,722,618 B1 | 8/2017 | Cheng |
| 9,729,159 B1 | 8/2017 | Cheng |
| 9,789,840 B2 | 10/2017 | Farooq et al. |
| 9,804,856 B1 | 10/2017 | Oh et al. |
| 9,847,111 B2 | 12/2017 | Shu et al. |
| 9,853,633 B1 | 12/2017 | Cheng et al. |
| 9,853,634 B2 | 12/2017 | Chang |
| 9,859,902 B2 | 1/2018 | Chang |
| 9,916,889 B1 | 3/2018 | Duong |
| 9,935,635 B2 | 4/2018 | Chuang et al. |
| 9,966,118 B2 | 5/2018 | Shu et al. |
| 10,065,594 B2 | 9/2018 | Fukawatase et al. |
| 10,153,042 B2 | 12/2018 | Ehrman et al. |
| 10,192,592 B2 | 1/2019 | Shu et al. |
| 10,249,312 B2 | 4/2019 | Kim et al. |
| 10,249,362 B2 * | 4/2019 | Shu ................ G11C 15/04 |
| 10,388,364 B2 | 8/2019 | Ishizu et al. |
| 10,425,070 B2 | 9/2019 | Chen et al. |
| 10,521,229 B2 | 12/2019 | Shu et al. |

(56) References Cited

U.S. PATENT DOCUMENTS

| | | |
|---|---|---|
| 10,535,381 B2 | 1/2020 | Shu et al. |
| 10,659,058 B1 | 5/2020 | Cheng et al. |
| 10,673,440 B1 | 6/2020 | Camarota |
| 10,720,205 B2 | 7/2020 | Huang et al. |
| 10,725,777 B2 | 7/2020 | Shu et al. |
| 10,770,133 B1 | 9/2020 | Haig et al. |
| 10,777,262 B1 | 9/2020 | Haig et al. |
| 10,847,213 B1 | 11/2020 | Haig et al. |
| 10,854,284 B1 | 12/2020 | Chuang et al. |
| 10,930,341 B1 | 2/2021 | Shu et al. |
| 10,943,648 B1 | 3/2021 | Shu et al. |
| 11,094,374 B1 | 8/2021 | Haig et al. |
| 11,205,476 B1 | 12/2021 | Haig et al. |
| 11,227,653 B1 | 1/2022 | Shu et al. |
| 2001/0052822 A1 | 12/2001 | Kim et al. |
| 2002/0006072 A1 | 1/2002 | Kunikiyo |
| 2002/0060938 A1 | 5/2002 | Song et al. |
| 2002/0136074 A1 | 9/2002 | Hanzawa et al. |
| 2002/0154565 A1 | 10/2002 | Noh et al. |
| 2002/0168935 A1 | 11/2002 | Han |
| 2003/0016689 A1 | 1/2003 | Hoof |
| 2003/0107913 A1 | 6/2003 | Nii |
| 2003/0185329 A1 | 10/2003 | Dickmann |
| 2004/0053510 A1 | 3/2004 | Little et al. |
| 2004/0062138 A1 | 4/2004 | Partsch et al. |
| 2004/0090413 A1 | 5/2004 | Yoo |
| 2004/0160250 A1 | 8/2004 | Kim et al. |
| 2004/0169565 A1 | 9/2004 | Gaggl et al. |
| 2004/0199803 A1 | 10/2004 | Suzuki et al. |
| 2004/0240301 A1 | 12/2004 | Rao |
| 2004/0264279 A1 | 12/2004 | Wordeman et al. |
| 2004/0264286 A1 | 12/2004 | Ware et al. |
| 2005/0024912 A1 | 2/2005 | Chen et al. |
| 2005/0026329 A1 | 2/2005 | Kim et al. |
| 2005/0036394 A1 | 2/2005 | Shiraishi |
| 2005/0186930 A1 | 8/2005 | Rofougaran et al. |
| 2005/0226079 A1 | 10/2005 | Zhu et al. |
| 2005/0226357 A1 | 10/2005 | Yoshimura |
| 2005/0253658 A1 | 11/2005 | Maeda et al. |
| 2005/0285862 A1 | 12/2005 | Noda et al. |
| 2006/0039227 A1 | 2/2006 | Lai et al. |
| 2006/0055434 A1 | 3/2006 | Tak et al. |
| 2006/0119443 A1 | 6/2006 | Azam et al. |
| 2006/0139105 A1 | 6/2006 | Maxim et al. |
| 2006/0143428 A1 | 6/2006 | Noda et al. |
| 2006/0248305 A1 | 11/2006 | Fang |
| 2007/0001721 A1 | 1/2007 | Chen et al. |
| 2007/0047283 A1 | 3/2007 | Miyanishi |
| 2007/0058407 A1 | 3/2007 | Dosaka et al. |
| 2007/0109030 A1 | 5/2007 | Park |
| 2007/0115739 A1 | 5/2007 | Huang |
| 2007/0139997 A1 | 6/2007 | Suzuki et al. |
| 2007/0171713 A1 | 7/2007 | Hunter et al. |
| 2007/0189101 A1 | 8/2007 | Lambrache et al. |
| 2007/0229129 A1 | 10/2007 | Nakagawa |
| 2008/0010429 A1 | 1/2008 | Rao |
| 2008/0049484 A1 | 2/2008 | Sasaki |
| 2008/0068096 A1 | 3/2008 | Feng et al. |
| 2008/0079467 A1 | 4/2008 | Hou et al. |
| 2008/0080230 A1 | 4/2008 | Liaw |
| 2008/0117707 A1 | 5/2008 | Manickavasakam et al. |
| 2008/0129402 A1 | 6/2008 | Han et al. |
| 2008/0155362 A1 | 6/2008 | Chang et al. |
| 2008/0175039 A1 | 7/2008 | Thomas et al. |
| 2008/0181029 A1 | 7/2008 | Joshi et al. |
| 2008/0265957 A1 | 10/2008 | Luong et al. |
| 2008/0273361 A1 | 11/2008 | Dudeck et al. |
| 2009/0027947 A1 | 1/2009 | Takeda |
| 2009/0089646 A1 | 4/2009 | Hirose et al. |
| 2009/0103390 A1 | 4/2009 | Kim et al. |
| 2009/0141566 A1 | 6/2009 | Arsovski |
| 2009/0154257 A1 | 6/2009 | Fukaishi et al. |
| 2009/0161468 A1 | 6/2009 | Fujioka |
| 2009/0231943 A1 | 9/2009 | Kunce et al. |
| 2009/0256642 A1 | 10/2009 | Lesso |
| 2009/0296869 A1 | 12/2009 | Chao et al. |
| 2009/0319871 A1 | 12/2009 | Shirai et al. |
| 2010/0020590 A1 | 1/2010 | Hsueh et al. |
| 2010/0085086 A1 | 4/2010 | Nedovic et al. |
| 2010/0157715 A1 | 6/2010 | Pyeon |
| 2010/0169675 A1 | 7/2010 | Kajihara |
| 2010/0172190 A1 | 7/2010 | Lavi et al. |
| 2010/0177571 A1 | 7/2010 | Ri et al. |
| 2010/0214815 A1 | 8/2010 | Tam et al. |
| 2010/0232202 A1* | 9/2010 | Lu ................. G11C 11/419 365/72 |
| 2010/0260001 A1 | 10/2010 | Kasprak et al. |
| 2010/0271138 A1 | 10/2010 | Thakur et al. |
| 2010/0322022 A1 | 12/2010 | Shinozaki et al. |
| 2011/0018597 A1 | 1/2011 | Lee et al. |
| 2011/0063898 A1 | 3/2011 | Ong |
| 2011/0153932 A1 | 6/2011 | Ware et al. |
| 2011/0211401 A1 | 9/2011 | Chan et al. |
| 2011/0267914 A1 | 11/2011 | Ishikura et al. |
| 2011/0280307 A1 | 11/2011 | Macinnis et al. |
| 2011/0292743 A1 | 12/2011 | Zimmerman |
| 2011/0299353 A1 | 12/2011 | Ito et al. |
| 2012/0049911 A1 | 3/2012 | Ura |
| 2012/0133114 A1 | 5/2012 | Choi et al. |
| 2012/0153999 A1 | 6/2012 | Kim |
| 2012/0212996 A1 | 8/2012 | Rao et al. |
| 2012/0242382 A1 | 9/2012 | Tsuchiya et al. |
| 2012/0243347 A1 | 9/2012 | Sampigethaya et al. |
| 2012/0250440 A1 | 10/2012 | Wu |
| 2012/0281459 A1 | 11/2012 | Teman et al. |
| 2012/0327704 A1 | 12/2012 | Chan et al. |
| 2013/0039131 A1 | 2/2013 | Haig et al. |
| 2013/0083591 A1 | 4/2013 | Wuu et al. |
| 2013/0170289 A1 | 7/2013 | Grover et al. |
| 2014/0056093 A1 | 2/2014 | Tran et al. |
| 2014/0125390 A1 | 5/2014 | Ma |
| 2014/0136778 A1 | 5/2014 | Khailany et al. |
| 2014/0185366 A1 | 7/2014 | Chandwani et al. |
| 2014/0269019 A1 | 9/2014 | Kolar et al. |
| 2014/0269901 A1* | 9/2014 | Shi ................. H04N 19/124 375/240.03 |
| 2015/0003148 A1 | 1/2015 | Iyer et al. |
| 2015/0029782 A1 | 1/2015 | Jung et al. |
| 2015/0063052 A1 | 3/2015 | Manning |
| 2015/0131383 A1 | 5/2015 | Akerib et al. |
| 2015/0187763 A1 | 7/2015 | Kim et al. |
| 2015/0213858 A1 | 7/2015 | Tao et al. |
| 2015/0248927 A1 | 9/2015 | Fujiwara et al. |
| 2015/0279453 A1 | 10/2015 | Fujiwara et al. |
| 2015/0302917 A1 | 10/2015 | Grover et al. |
| 2015/0310901 A1 | 10/2015 | Jung et al. |
| 2015/0357028 A1 | 12/2015 | Huang et al. |
| 2016/0005458 A1 | 1/2016 | Shu et al. |
| 2016/0027500 A1 | 1/2016 | Chuang et al. |
| 2016/0064068 A1 | 3/2016 | Mojumder et al. |
| 2016/0141021 A1 | 5/2016 | Mojumder et al. |
| 2016/0141023 A1 | 5/2016 | Jung et al. |
| 2016/0225436 A1 | 8/2016 | Wang et al. |
| 2016/0225437 A1 | 8/2016 | Kumar et al. |
| 2016/0247559 A1 | 8/2016 | Atallah et al. |
| 2016/0254045 A1 | 9/2016 | Mazumder et al. |
| 2016/0284392 A1 | 9/2016 | Block et al. |
| 2016/0329092 A1 | 11/2016 | Akerib |
| 2017/0194046 A1 | 7/2017 | Yeung, Jr. et al. |
| 2017/0345505 A1 | 11/2017 | Noel et al. |
| 2018/0121130 A1 | 5/2018 | Li et al. |
| 2018/0122456 A1 | 5/2018 | Li et al. |
| 2018/0123603 A1 | 5/2018 | Chang |
| 2018/0157621 A1 | 6/2018 | Shu et al. |
| 2018/0158517 A1 | 6/2018 | Shu et al. |
| 2018/0158518 A1 | 6/2018 | Shu et al. |
| 2018/0158519 A1 | 6/2018 | Shu et al. |
| 2018/0158520 A1 | 6/2018 | Shu et al. |
| 2020/0117398 A1 | 4/2020 | Haig et al. |
| 2020/0160905 A1 | 5/2020 | Charles et al. |
| 2020/0243154 A1* | 7/2020 | Sity ................. G11C 29/36 |
| 2020/0301707 A1 | 9/2020 | Shu et al. |
| 2020/0403616 A1 | 12/2020 | Shu et al. |
| 2021/0027815 A1 | 1/2021 | Shu et al. |

(56) References Cited

U.S. PATENT DOCUMENTS

| | | |
|---|---|---|
| 2021/0027834 A1 | 1/2021 | Haig et al. |
| 2021/0216246 A1 | 7/2021 | Haig et al. |
| 2021/0225436 A1 | 7/2021 | Shu et al. |
| 2021/0225437 A1 | 7/2021 | Shu et al. |

FOREIGN PATENT DOCUMENTS

| | | |
|---|---|---|
| JP | 2005346922 A | 12/2005 |
| TW | 201812770 A | 4/2018 |

OTHER PUBLICATIONS

Takahiko et al., "A Ratio-Less 10-Transistor Cell and Static Column Retention Loop Structure for Fully Digital SRAM Design", Journal: 2012 4th IEEE International Memory Workshop: 2012, ISBN: 9781467310796 (5 pages).

Wang et al., "A Two-Write and Two-Read Multi-Port SRAM with Shared Write Bit-Line Scheme and Selective Read Path for Low Power Operation", Journal of Low Power Electronics vol. 9. 9-22, 2013, Department of Electronics Engineering and Institute of Electronics, National Chiao-Tung University, Hsinchu 300, Taiwan (Received: Oct. 15, 2012: Accepted: Feb. 11, 2013), 14 pages.

\* cited by examiner

ORTHOGONAL DATA TRANSPOSITION SYSTEM AND METHOD DURING DATA TRANSFERS TO/FROM A PROCESSING ARRAY

PRIORITY CLAIM/RELATED APPLICATIONS

This application is a divisional and claims priority under 35 USC 120, 121 to U.S. patent application Ser. No. 16/150,176 filed Oct. 2, 2018 that is a continuation in part of and claims priority under 35 USC 120 to U.S. patent application Ser. No. 15/709,399, filed Sep. 19, 2017 and entitled "Computational Dual Port Sram Cell And Processing Array Device Using The Dual Port Sram Cells For Xor And Xnor Computations", U.S. patent application Ser. No. 15/709,401, filed Sep. 19, 2017 and entitled "Computational Dual Port Sram Cell And Processing Array Device Using The Dual Port Sram Cells For Xor And Xnor Computations", U.S. patent application Ser. No. 15/709,379, filed Sep. 19, 2017 and entitled "Computational Dual Port Sram Cell And Processing Array Device Using The Dual Port Sram Cells", U.S. patent application Ser. No. 15/709,382, filed Sep. 19, 2017 and entitled "Computational Dual Port Sram Cell And Processing Array Device Using The Dual Port Sram Cells", and U.S. patent application Ser. No. 15/709,385, filed Sep. 19, 2017 and entitled "Computational Dual Port Sram Cell And Processing Array Device Using The Dual Port Sram Cells" that in turn claim priority under 35 USC 119(e) and 120 and claim the benefit of U.S. Provisional Patent Application No. 62/430,767, filed Dec. 6, 2016 and entitled "Computational Dual Port Sram Cell And Processing Array Device Using The Dual Port Sram Cells For Xor And Xnor Computations" and U.S. Provisional Patent Application No. 62/430,762, filed Dec. 6, 2016 and entitled "Computational Dual Port Sram Cell And Processing Array Device Using The Dual Port Sram Cells", the entirety of all of which are incorporated herein by reference.

FIELD

The disclosure relates generally to a device and method for connecting a processing array to a storage memory and in particular to a device and method that 1) transposes the data words output from the processing array for storage in the storage memory; and 2) transposes the data words from the storage to the processing array since the storage memory and the processing array store data differently.

BACKGROUND

A storage memory in a computer system or another conventional storage memory may be connected to each other by a data bus, DBus(63:0), as shown in FIG. 1. As shown in FIG. 1A, the data words in the storage memory are stored in the same orientation as the data words in the other conventional storage memory.

In contrast, each bit line in a processing array essentially functions as a mini-processor and has a plurality of computational memory cells connected to each bit line. In a processing array with the plurality of computational memory cells, reading multiple computational memory cells along the same bit line simultaneously produces a logical function (e.g. logical AND) of the memory cell contents on the read bit line. Additional circuitry can be implemented around the bit line and its associated memory cells to enable more complex logical operations on the data stored in those memory cells. The processing array may have a plurality of sections wherein each section has a plurality of bit line sections and each bit line section has a plurality of computational memory cells whose read bit lines are connected together to produce the logical function. Because the bit line is the central processing element in the processing array, and because all bit lines within each section receive the same control signals and therefore perform the same computations on their respective data, data words are stored in the processing array along bit lines (with each bit on a separate word line)—either entirely on the same bit line within a section or along the same relative bit line across multiple sections.

For example, one way to add two 16-bit data words is to store the first LSB of each data word in memory cells on bit line 0 in section 0, the second LSB of each data word in memory cells on bit line 0 in section 1, etc. Then, the software algorithm performs the logic and shift operations necessary to add the two 16-bit data words together; shift operations are needed to shift the carry bit result from section 0 to section 1 after adding the first LSBs in section 0, to shift the carry bit result from section 1 to section 2 after adding the carry bit from section 0 to the second L2Bs in section 1, etc. In this way, if the processing array consists of 16 sections with "n" bit lines per section, then "n" simultaneous 16-bit ADD operations can be performed.

The way that data words are stored in the processing array—i.e. along the same bit line (with each bit on a separate word line)—is orthogonal to how data words are conventionally stored in a memory array used exclusively for storage (e.g. storage memory)—i.e. along the same word line (with each bit on a separate bit line). Consequently, when data words are transferred between storage memory and the processing array, a mechanism is needed to orthogonally transpose the data and it is to that end that this disclosure is directed.

BRIEF DESCRIPTION OF THE DRAWINGS

FIGS. 4A to 4C is an expansion of FIG. 2 that depicts the transposer constructed as a 64-row by n-column array of register bits. The diagram illustrates the data byte layout in storage memory, the transposer, and the processing array when data is transferred between them.

FIGS. 6B-1 to 6B-6 is an expansion of FIG. 6A that depicts the transposer constructed as a 64-row by 64-column array of register bits, and that depicts the buffer constructed as a 64-row by n-column array of storage elements. The diagram illustrates the data byte layout in storage memory, the transposer, the buffer, and the processing array when data is transferred between them.

FIGS. 6C-1 to 6C-2 depict the transposer from FIGS. 6B-1 to 6B-6 constructed as a two-way shift register. The diagram illustrates how data is column-shifted through the transposer during data transfers between it and storage memory, and how data is row-shifted through the transposer during data transfers between it and the buffer.

DETAILED DESCRIPTION OF ONE OR MORE EMBODIMENTS

The disclosure is particularly applicable to a processing array device using SRAM memory cells in which data words are stored along word lines in storage memory and other conventional storage memory, and data words are stored along bit lines in the processing array and it is in this context that the disclosure will be described. It will be appreciated, however, that the apparatus and method has greater utility, such as to being used with other processing array devices. The device and method may orthogonally transpose the data transferred between the storage memory and the processing array device. The device and method may use a transposer or the combination of a transposer and a buffer to perform the orthogonal transposing of the data. In the embodiments described below, the data being transposed may be a certain number of bit units of data that are transferred between the storage memory and the processing array device. Examples using a sixty four bit unit of data, a thirty two bit unit of data, a sixteen bit unit of data and an eight bit unit of data are provided below although the device and method may operate with other different sized units of data. For purposes of the disclosure, all of the above different sized bit units of data that may be transferred by the device and method will be known as a unit of data.

First Embodiment

Figure 2:
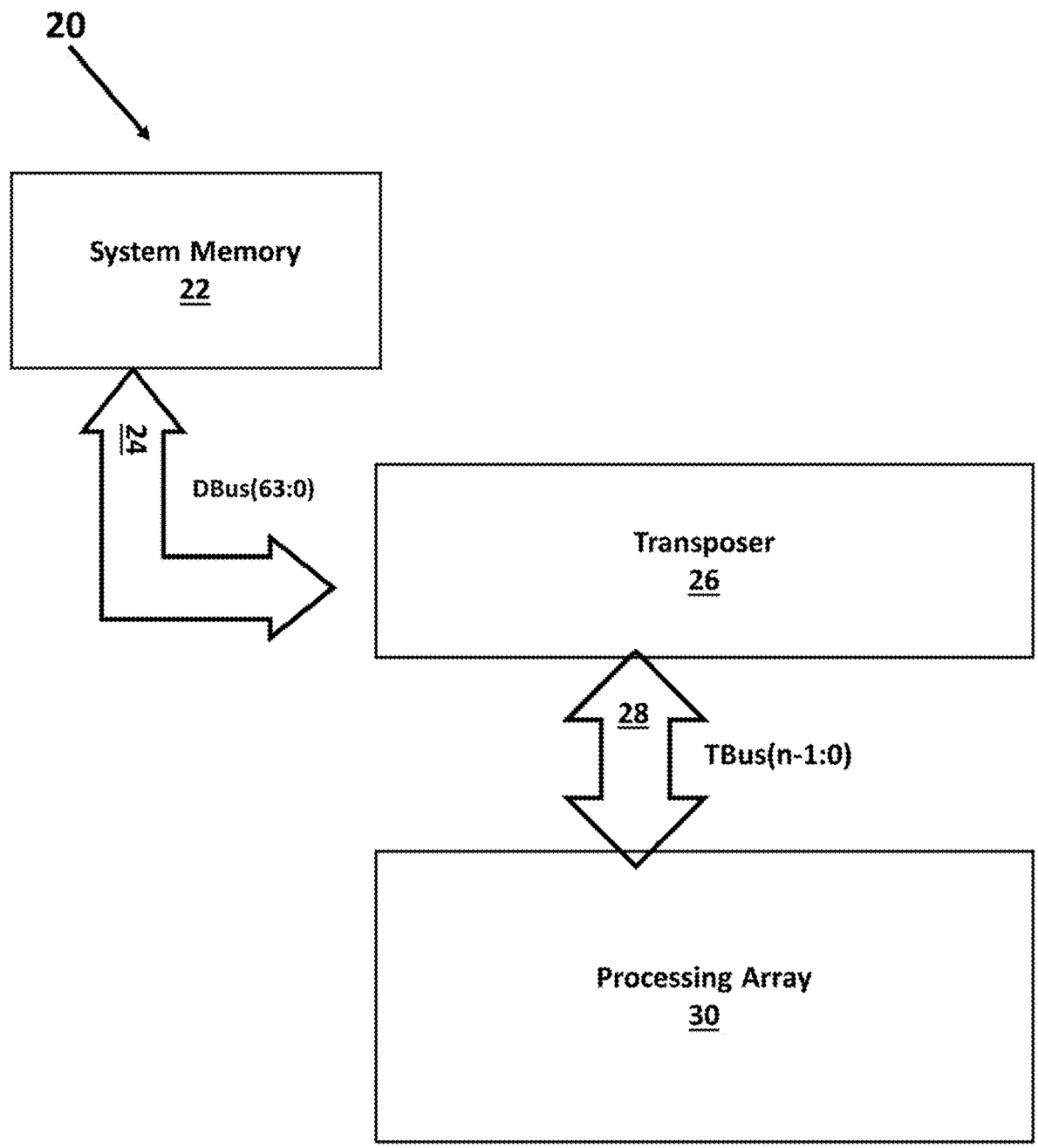
FIG. 2 depicts storage memory connected to a processing array via an intermediate transposer that orthogonally transposes the data during data transfers between the two memory arrays. In this depiction, a 64-bit data bus facilitates data transfers between storage memory and the transposer, and an n-bit data bus facilitates data transfers between the transposer and the processing array.

FIG. 2 depicts a first embodiment of a processing unit 20 that includes a storage memory 22 connected to a processing array 30 (constructed from a plurality of computational memory cells) via a data path 26, that may be an intermediate transposer 26 in one implementation, that orthogonally transposes the data during data transfers between the storage memory array 22 and the processing array 30 since data words are stored along word lines in storage memory 22 and other conventional storage memory and data words are stored along bit lines in the processing array 30. In this depiction, a 64-bit data bus 24, DBus(63:0) for example shown in FIG. 2, facilitates data transfers between storage memory 22 and the transposer 26, and an n-bit data bus 28, TBus(n-1:0) for example shown in FIG. 2, facilitates data transfers between the transposer 26 and the processing array 30. The elements of the processing unit 20 shown in FIG. 2 may be housed in a single semiconductor chip/integrated circuit (with a single die or multiple dies) or multiple integrated circuits. Alternatively, the processing array 30 and transposer 26 may be part of the integrated processing unit 20 (a single integrated circuit or semiconductor chip with one or multiple dies) while the storage memory 22 may be separate.

One way to orthogonally transpose data during data transfers between storage memory 22 and the processing array 30 is to implement a two-dimensional storage array block between them that facilitates the orthogonal data transposition. This intermediate storage block is henceforth referred to as the "transposer" 26. When a transposer is utilized in this manner, data transfers between storage memory 22 and the processing array 30 may be accomplished in two steps:

1. A data transfer between storage memory 22 and the transposer 26.
2. A data transfer between the transposer 26 and the processing array 30.

The execution order of the two steps depends on the direction of data transfer, storage memory→processing array or processing array→storage memory.

Figure 3A:
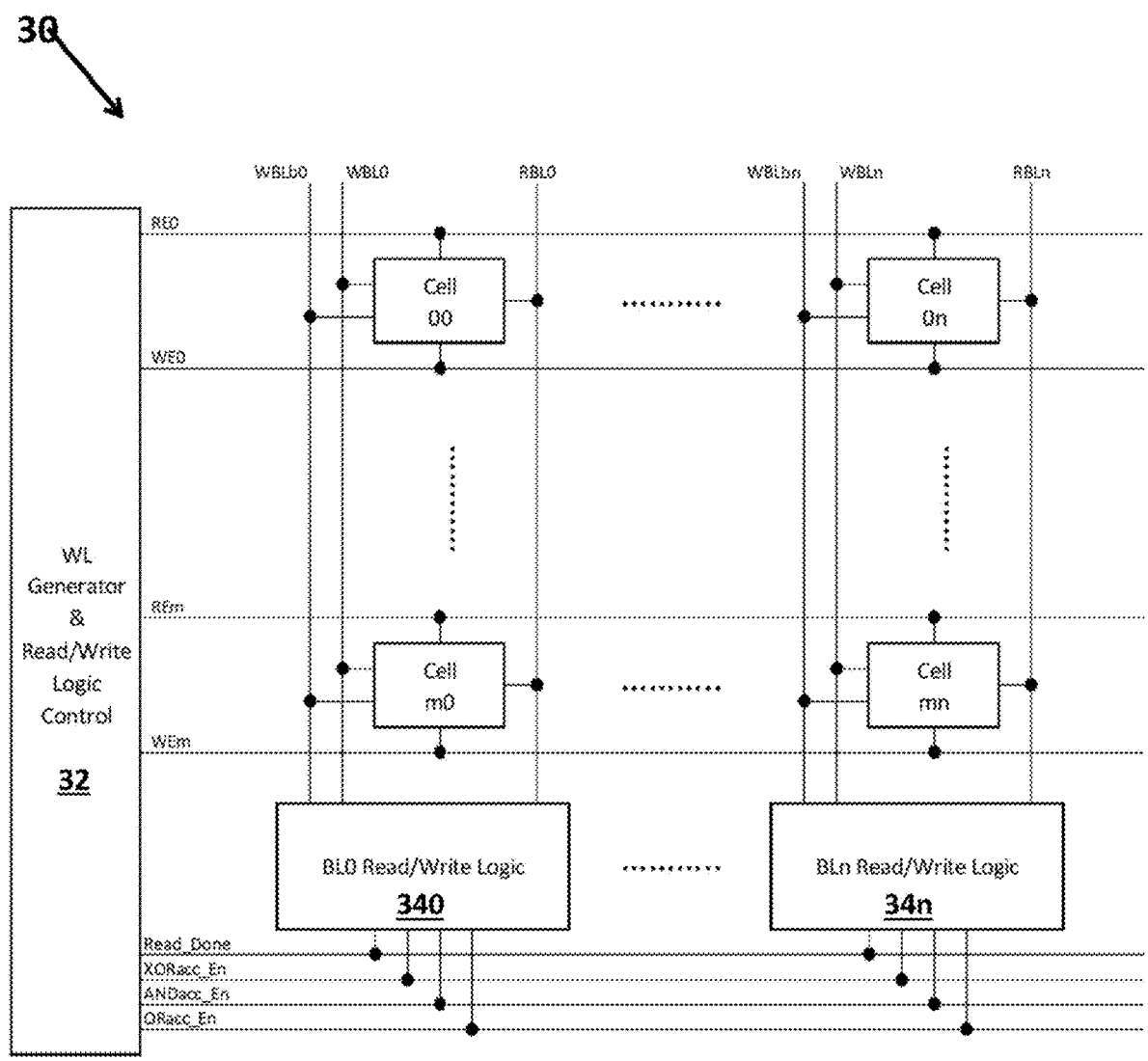
FIGS. 3A to 3C illustrate an example of the processing array shown in FIGS. 2, 4, 6A and 6B that may be used with the transposer.
Figure 3B:
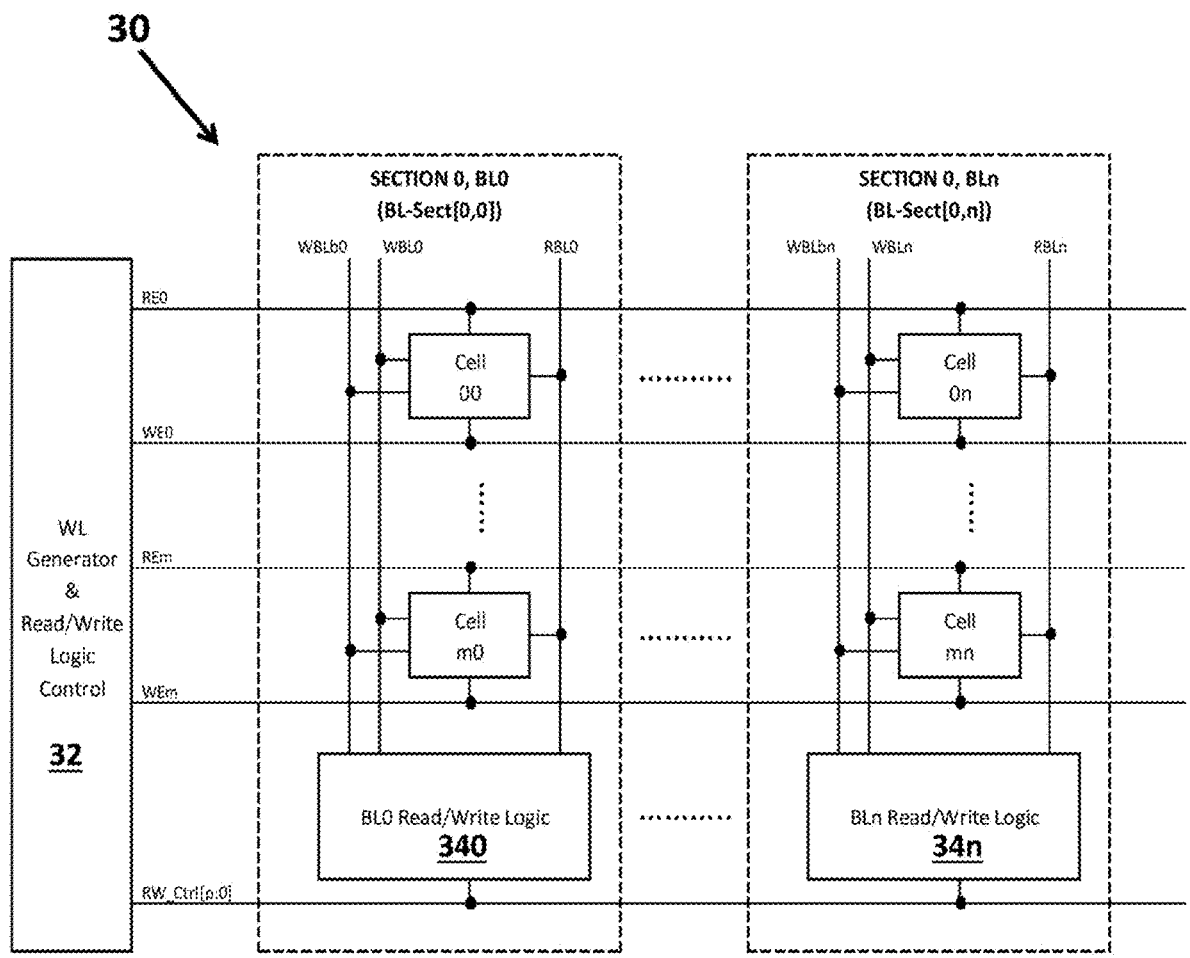
Figure 3C:
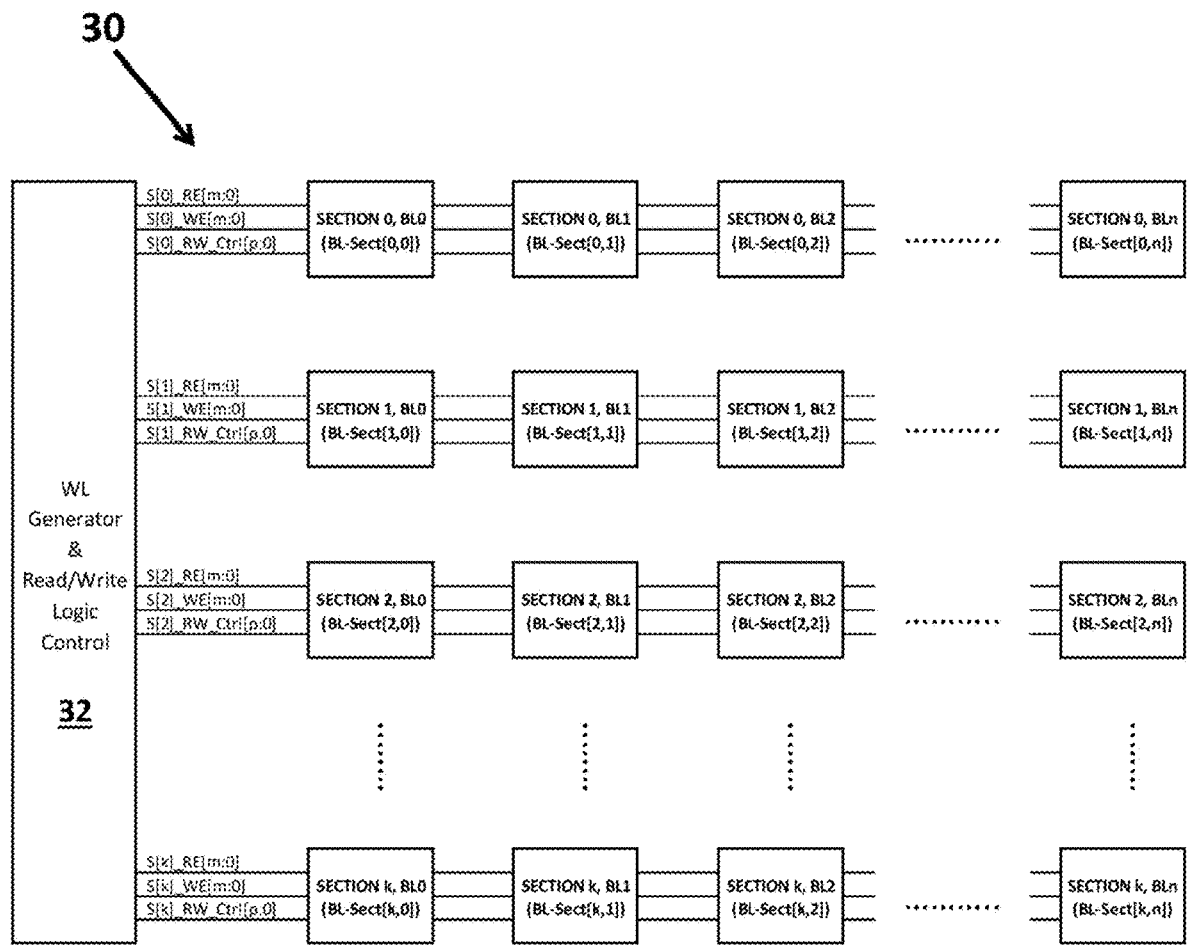

An example of the processing array 30 that may be used with the processing unit 20 and transposer 26 is shown in FIGS. 3A to 3C although it is understood that the transposer 26 may be used with other processing arrays 30 is a similar manner that are within the scope of this disclosure. FIG. 3A illustrates an example of a processing array 30 with computational memory cells in an array that may be incorporated into a semiconductor memory or computer system and may include transposer circuitry. The processing array 30 may include an array of computational memory cells (cell 00, . . . , cell 0n and cell m0, . . . , cell mn). In one embodiment, the array of computational memory cells may be rectangular as shown in FIG. 3A and may have a plurality of columns and a plurality of rows wherein the computational memory cells in a particular column may also be connected to the same read bit line (RBL0, . . . , RBLn). The processing array 30 may further include a wordline (WL) generator and read/write logic control circuit 32 that may be connected to and generate signals for the read word line (RE) and write word line (WE) for each memory cell (such as RE0, . . . , REn and WE0, . . . , WEn) to control the read and write operations is well known and one or more read/write circuitry 34 that are connected to the read and write bit lines of the computational memory cells. The wordline (WL) generator and read/write logic control circuit 32 may also generate one or more control signals that control each read/write circuitry 34.

In the embodiment shown in FIG. 3A, the processing array may have read/write circuitry 34 for each set of bit line signals of the computational memory cells (e.g., for each column of the computational memory cells whose read bit lines are connected to each other). For example, BL0 read/write logic 340 may be coupled to the read and write bit lines (WBLb0, WBL0 and RBL0) for the computational memory cells in column 0 of the array and BLn read/write logic 34n may be coupled to the read and write bit lines (WBLbn, WBLn and RBLn) for the computational memory cells in column n of the array as shown in FIG. 3A.

During a read operation, the wordline (WL) generator and read/write logic control circuit 32 may activate one or more word lines that activate one or more computational memory cells so that the read bit lines of those one or more computational memory cells may be read out. Further details of the read operation are not provided here since the read operation is well known.

Each computational memory cell in the processing array may be a static random access memory (SRAM) cell based computational memory cell that is able to perform a computation as described above. It is noted that the processing array 30 may be constructed using other different types of memory cells. The details of an exemplary computational memory cell that may be used as part of the processing array 30 may be found in co-pending patent application Ser. No. 15/709,399, filed Sep. 19, 2017 and entitled "Computational Dual Port Sram Cell And Processing Array Device Using The Dual Port Sram Cells For Xor And Xnor Computations", U.S. patent application Ser. No. 15/709,401, filed Sep. 19, 2017 and entitled "Computational Dual Port Sram Cell And Processing Array Device Using The Dual Port Sram Cells For Xor And Xnor Computations", U.S. patent application Ser. No. 15/709,379, filed Sep. 19, 2017 and entitled "Computational Dual Port Sram Cell And Processing Array Device Using The Dual Port Sram Cells", U.S. patent application Ser. No. 15/709,382, filed Sep. 19, 2017 and entitled "Computational Dual Port Sram Cell And Processing Array Device Using The Dual Port Sram Cells", and U.S. patent application Ser. No. 15/709,385, filed Sep. 19, 2017 and entitled "Computational Dual Port Sram Cell And Processing Array Device Using The Dual Port Sram Cells" and U.S. Provisional Patent Application No. 62/430,767, filed Dec. 6, 2016 and entitled "Computational Dual Port Sram Cell And Processing Array Device Using The Dual Port Sram Cells For Xor And Xnor Computations" and U.S. Provisional Patent Application No. 62/430,762, filed Dec. 6, 2016 and entitled "Computational Dual Port Sram Cell And Processing Array Device Using The Dual Port Sram Cells", all of which are incorporated by reference herein.

FIGS. 3B and 3C illustrate the processing array 30 with computational memory cells having sections having the same elements as shown in FIG. 3A. The array 30 in FIG. 3B has one section (Section 0) with "n" bit lines (bit line 0 (BL0), . . . , bit line n (BLn)) in different bit line sections (b1-sect), where each bit line connects to "m" computational memory cells (cell 00, . . . , cell m0 for bit line 0, for example). In the example in FIG. 3B, the m cells may be the plurality of computational memory cells that are part of each column of the array 30. FIG. 3C illustrates the processing array 30 with computational memory cells having multiple sections. In the example in FIG. 3C, the processing array device 30 comprises "k" sections with "n" bit lines each, where each bit line within each section connects to "m" computational memory cells. Note that the other elements of the processing array 30 are present in FIG. 3C, but not shown for clarity. In FIG. 3C, the BL-Sect(0,0) block shown corresponds to the BL-Sect(0,0) shown in FIG. 3B with the plurality of computational memory cells and the read/write logic 340 and each other block shown in FIG. 3C corresponds to a separate portion of the processing array. As shown in FIG. 3C, the set of control signals, generated by the wordline generator and read/write logic controller 32, for each section may include one or more read enable control signals (for example S[0]_RE[m:0] for section 0), one or more write enable control signals (for example S[0]_WE[m:0] for section 0) and one or more read/write control signals (for example S[0]_RW_Ctrl[p:0] for section 0). As shown in FIG. 3C, the array 30 may have a plurality of sections (0, . . . , k in the example in FIG. 3C) and each section may have multiple bit line sections (0, . . . , n per section, in the example in FIG. 3C).

Returning to FIG. 2, in the first embodiment, the transposer 26 is constructed as a two-way shift register array with "x" rows and "y" columns. The number of rows "x" is equal to the width of the data bus "DBus" that connects the transposer 26 to storage memory 22; e.g. x=64 if DBus=64 bits. The number of columns "y" is equal to the number of columns (i.e. bit lines) in a processing array section—e.g. y=n if a processing array section has "n" bit lines, and establishes the width of the data bus "TBus" that connects the transposer to the processing array—e.g. if y=n then TBus=n bits. The number of columns in the transposer is equal to the number of columns in a processing array section so that all columns associated with a particular row in a particular processing array section can be written to or read from simultaneously, thereby eliminating the need for any sort of column-addressability within a processing array section.

Figure 4A:
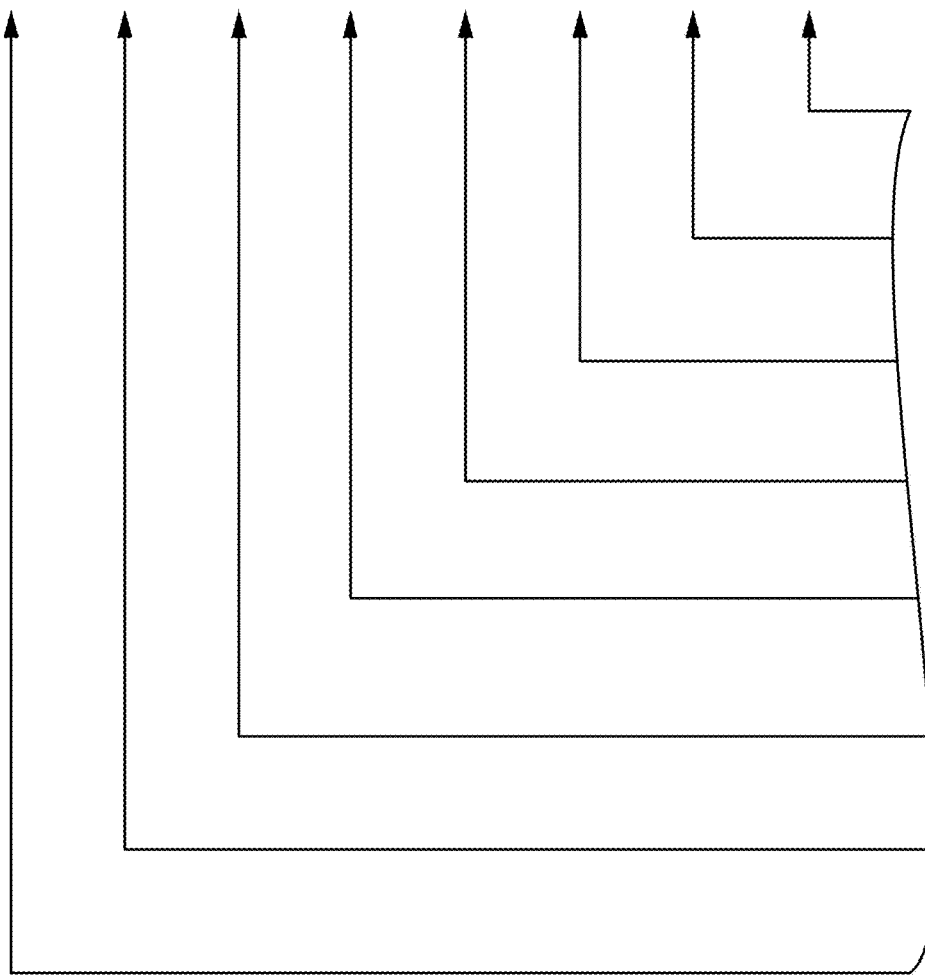
Figure 4B:
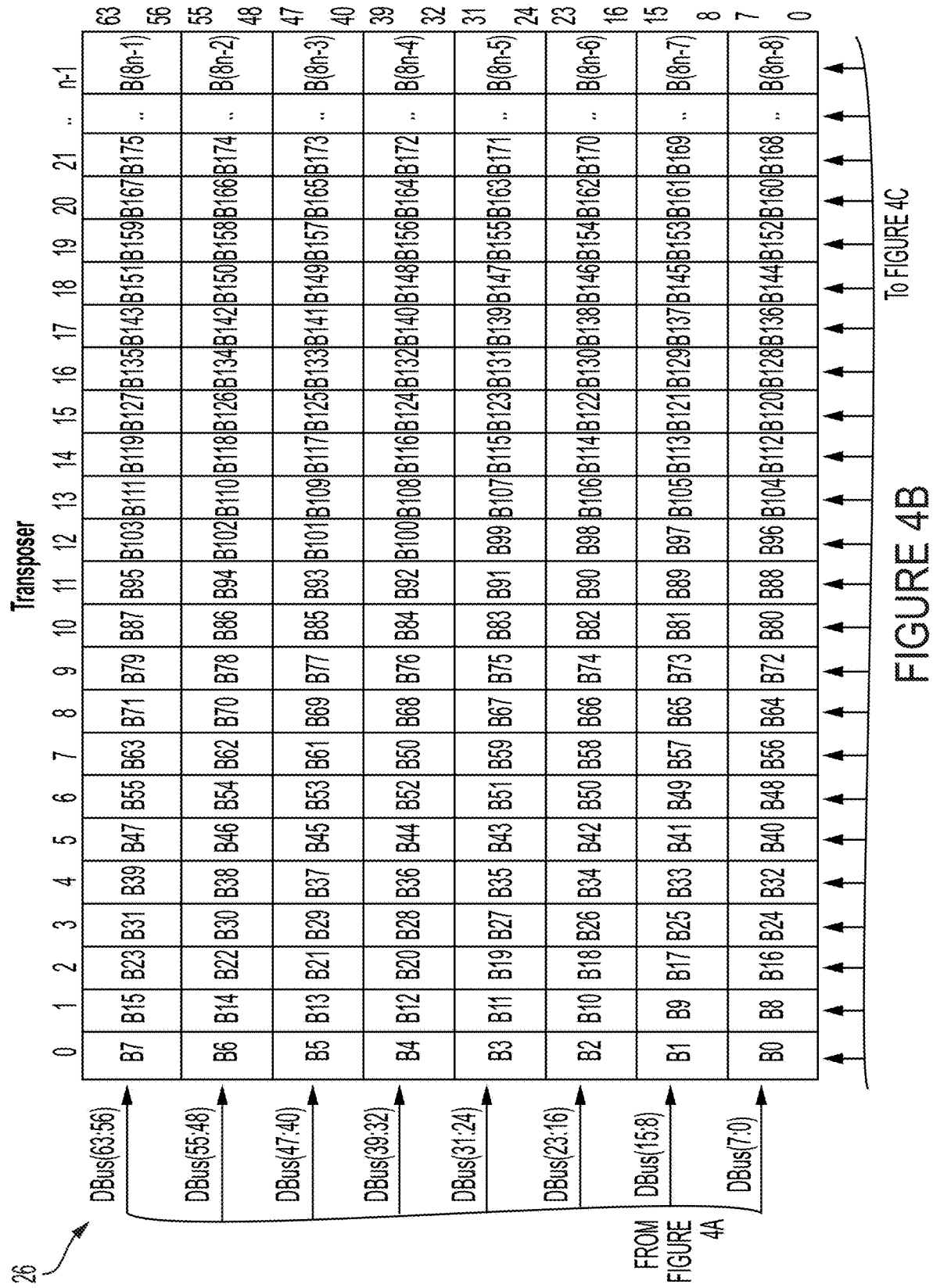
Figure 4C:
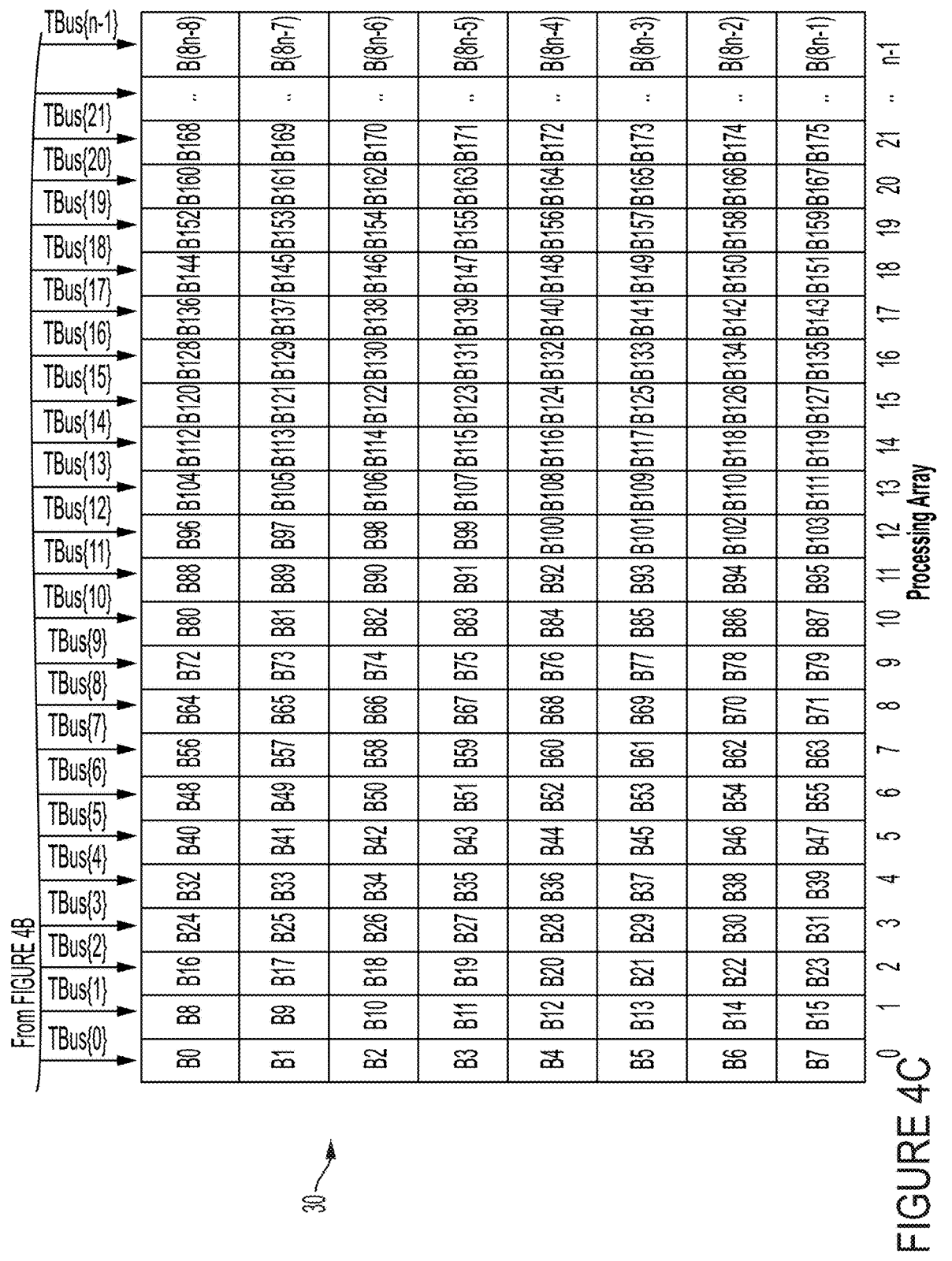

An example of the transposer 26 constructed as a 64-row by n-column array of register bits, where "n" is equal to the number of columns (bit lines) in a section of the processing array 30 is shown in FIGS. 4A to 4C. FIGS. 4A to 4C illustrates that the initial data byte layout in storage memory 22, or after "n" units of 64-bit column data have been transferred from the transposer to storage memory, the data byte layout in the transposer after "n" units of 64-bit column data have been transferred from storage memory to the transposer, or after 64 units of n-bit row data have been transferred from the processing array to the transposer; and the data byte layout in the processing array after 64 units of n-bit row data have been transferred from the transposer to the processing array.

Operation of First Embodiment

The processing unit 20 with the storage memory 22, the transposer 26 and the processing array 30 may be operated to transfer data from the storage memory 22 to the processing array 30 and to transfer data from the processing array 30 to the storage memory 22 using different processes, each of which is now described in more detail.

During Storage Memory 22 to Processing Array 30 Data Transfers
1. When data is transferred from storage memory 22 to the transposer 26 on the 64-bit data bus "DBus(63:0)", the following occurs simultaneously:
   The 64-bit unit of transfer data on DBus(63:0) is stored in column "n−1", rows 63:0 of the transposer.
   The 64-bit units of previously-loaded data in columns 1 through "n−1" of the transposer are column-shifted to columns 0 through "n−2".
   The 64-bit unit of previously-loaded data in column 0, rows 63:0 of the transposer is discarded.

This procedure repeats until all "n" columns of the transposer have been loaded with storage memory data. The column shifting is the first of the two ways in which the transposer can be shifted.

2. When data is subsequently transferred from the transposer 26 to the processing array 30 on an n-bit data bus "TBus(n–1:0)", the following occurs simultaneously:

The n-bit unit of data in row 0, columns n–1:0 of the transposer is output to TBus(n–1:0).

The n-bit units of data in rows 1 through 63 of the transposer are row-shifted to rows 0 through 62.

A logic "0" is stored in row 63, columns n–1:0 of the transposer. This is arbitrary—the state of the transposer doesn't matter after storage memory data has been transferred to the processing array.

This procedure repeats until all 64 rows of transposer data have been transferred to the processing array 30. The row shifting is the second of the two ways in which the transposer can be shifted.

During Processing Array 30 to Storage Memory 22 Data Transfers:

1. When data is transferred from the processing array to the transposer on a n-bit data bus "TBus(n–1:0)", the following occurs simultaneously:

The n-bit unit of transfer data on TBus(n–1:0) is stored in row 63, columns n–1:0 of the transposer.

The n-bit units of previously-loaded data in rows 1 through 63 of the transposer are row-shifted to rows 0 through 62.

The n-bit unit of previously-loaded data in row 0, columns n–1:0 of the transposer is discarded.

This procedure repeats until all 64 rows of the transposer have been loaded with processing array data.

2. When data is subsequently transferred from the transposer to storage memory on a 64-bit data bus "DBus(63:0)", the following occurs simultaneously:

The 64-bit unit of data in column 0, rows 63:0 of the transposer is output to DBus(63:0).

The 64-bit units of data in columns 1 through "n–1" of the transposer are column-shifted to columns 0 through "n–2".

A logic "0" is stored in column "n–1", rows 63:0 of the transposer. This is arbitrary—the state of the transposer doesn't matter after the processing array data has been transferred to storage memory.

This procedure repeats until all "n" columns of transposer data have been transferred to storage memory.

Transposer Exemplary Implementation

Figure 5:
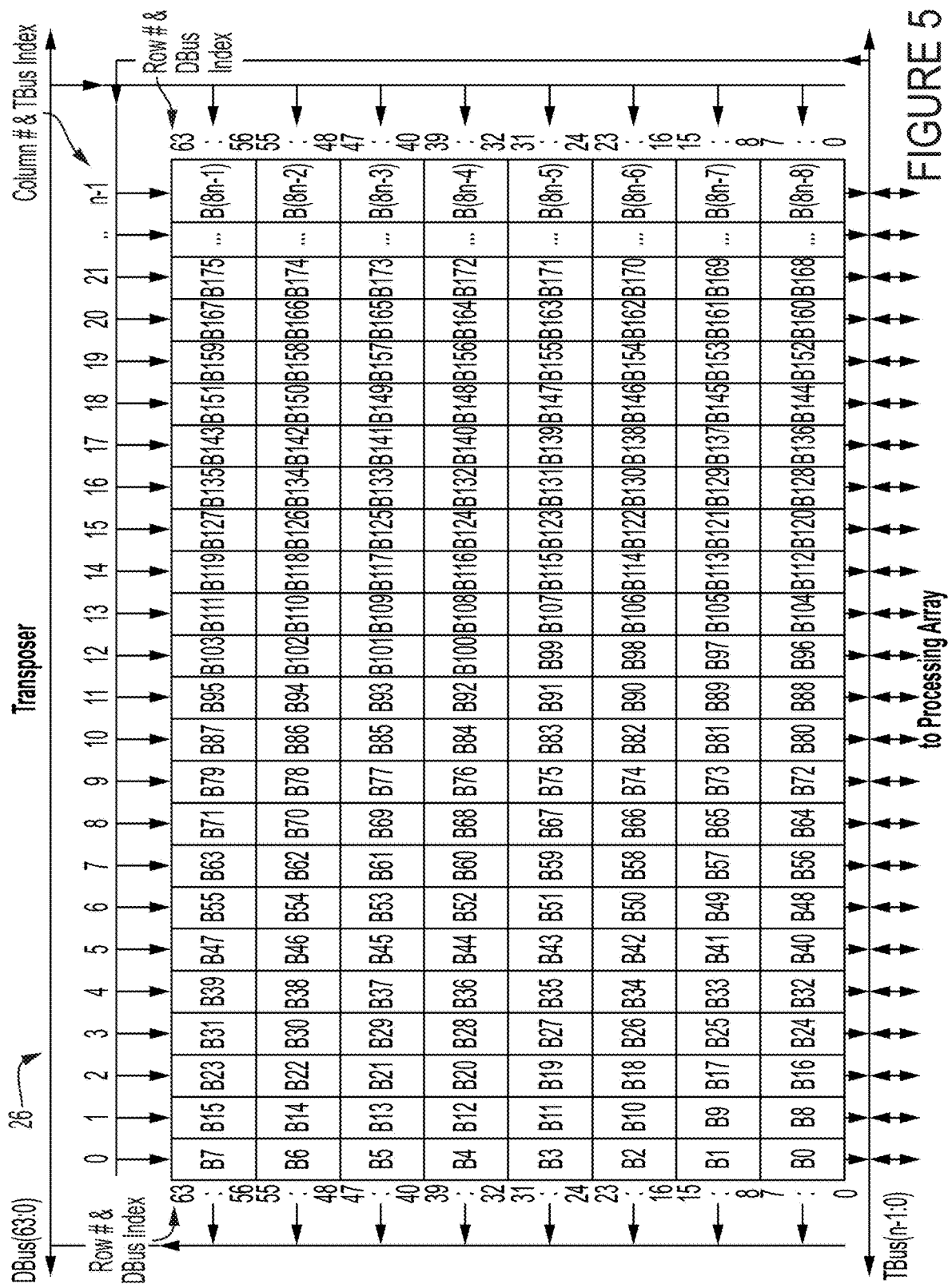
FIG. 5 depicts an exemplary implementation of the transposer from FIG. 2 or 4 constructed as a two-way shift register. The diagram illustrates how data is column-shifted through the transposer during data transfers between it and storage memory, and how data is row-shifted through the transposer during data transfers between it and the processing array.
Figure 6A:
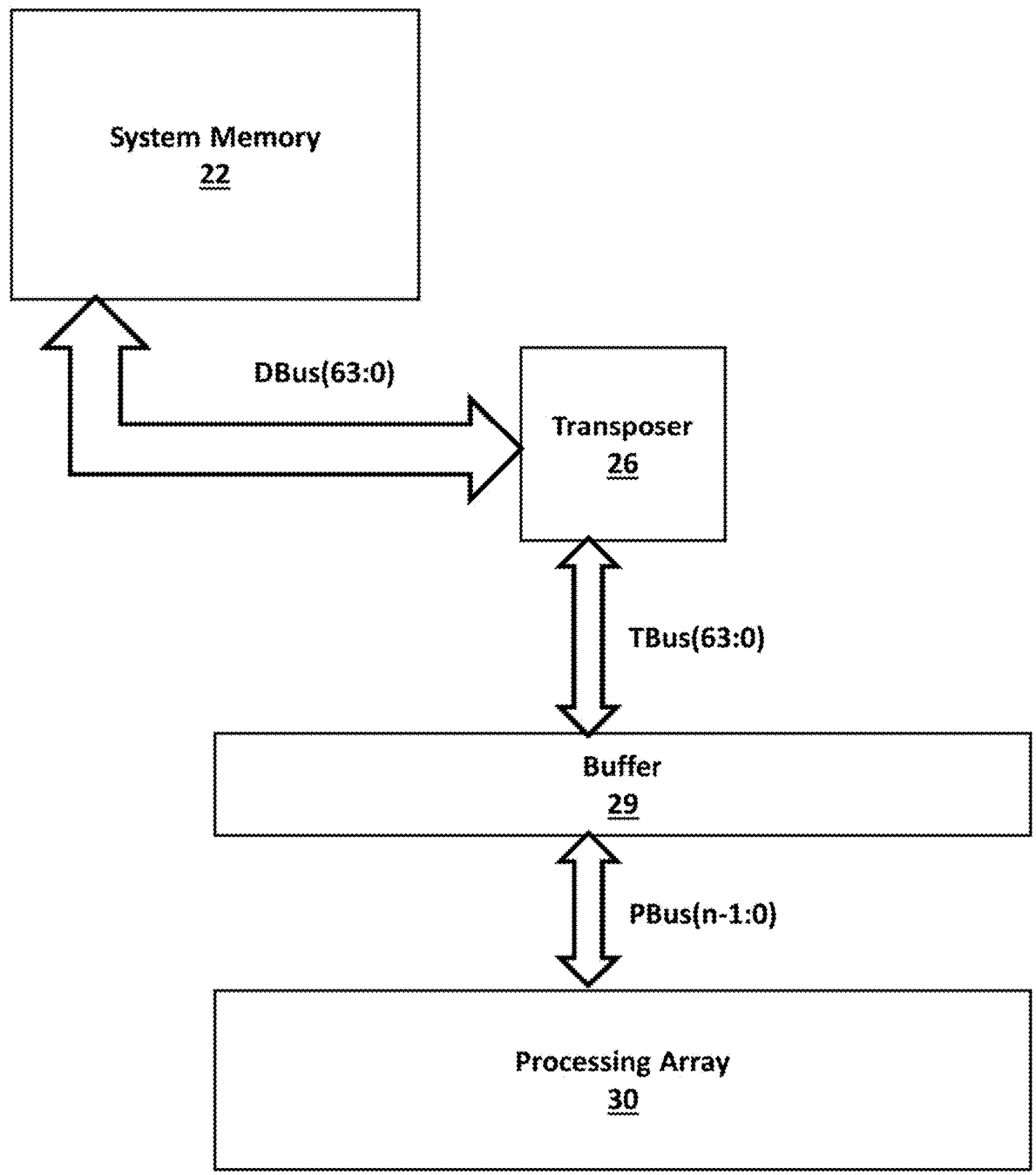
FIG. 6A depicts storage memory connected to a processing array via an intermediate transposer that orthogonally transposes the data during data transfers between the two memory arrays, and via an intermediate "buffer" that buffers data transfers between the transposer and the processing array. In this depiction, a 64-bit data bus facilitates data transfers between storage memory and the transposer, a 64-bit data bus facilitates data transfers between the transposer and the buffer, and an n-bit data bus facilitates data transfers between the buffer and the processing array.
Figures 1, 6B:
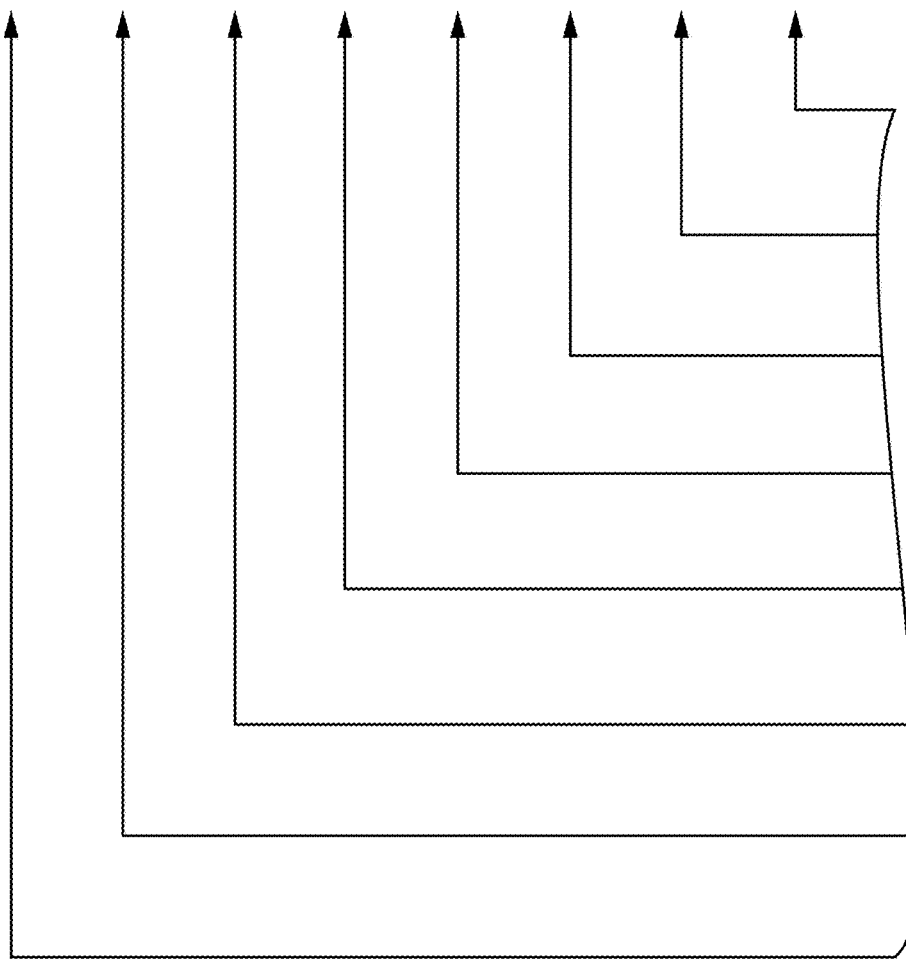
Figures 2, 6B:
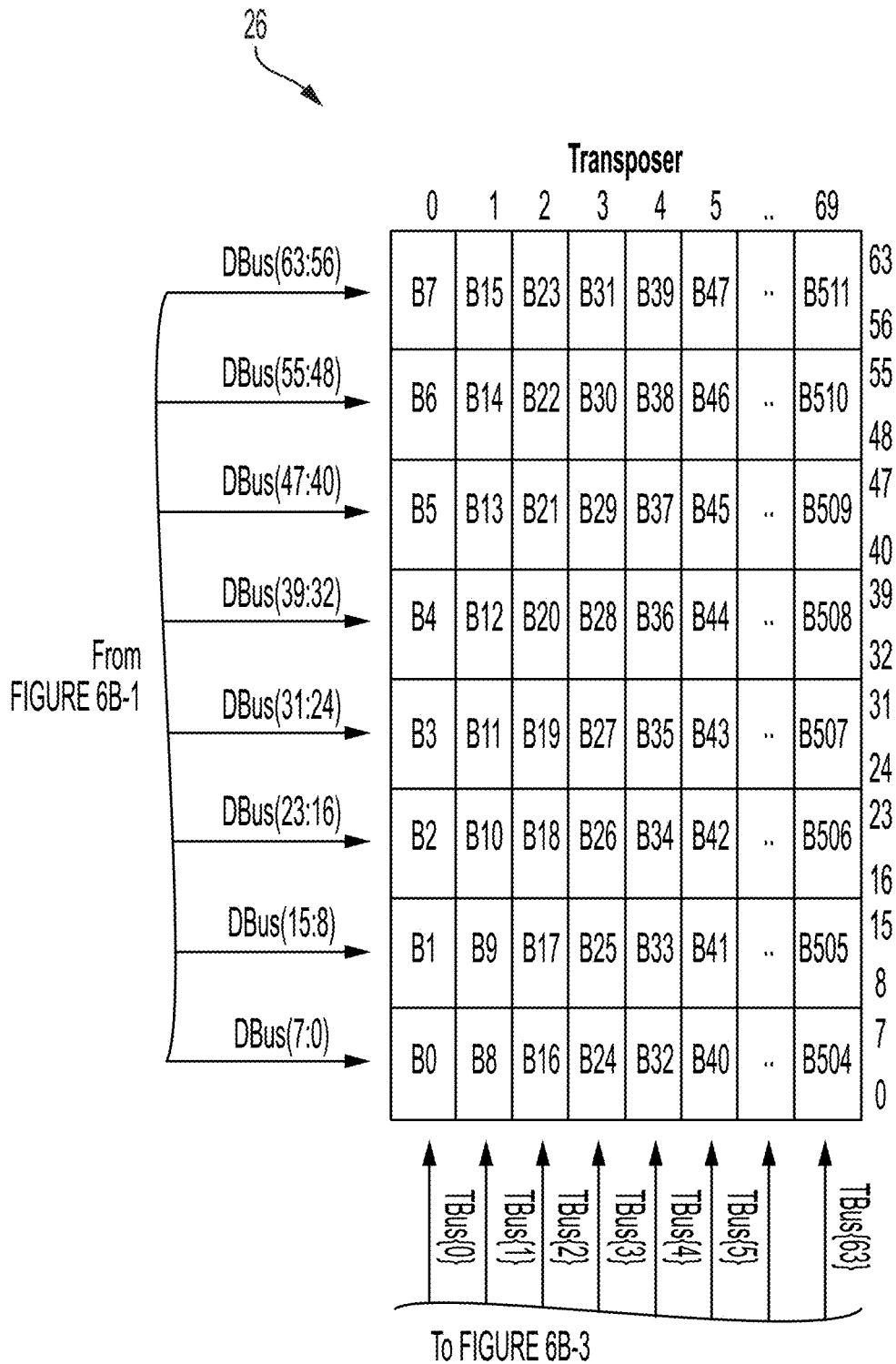
Figures 3, 6B:
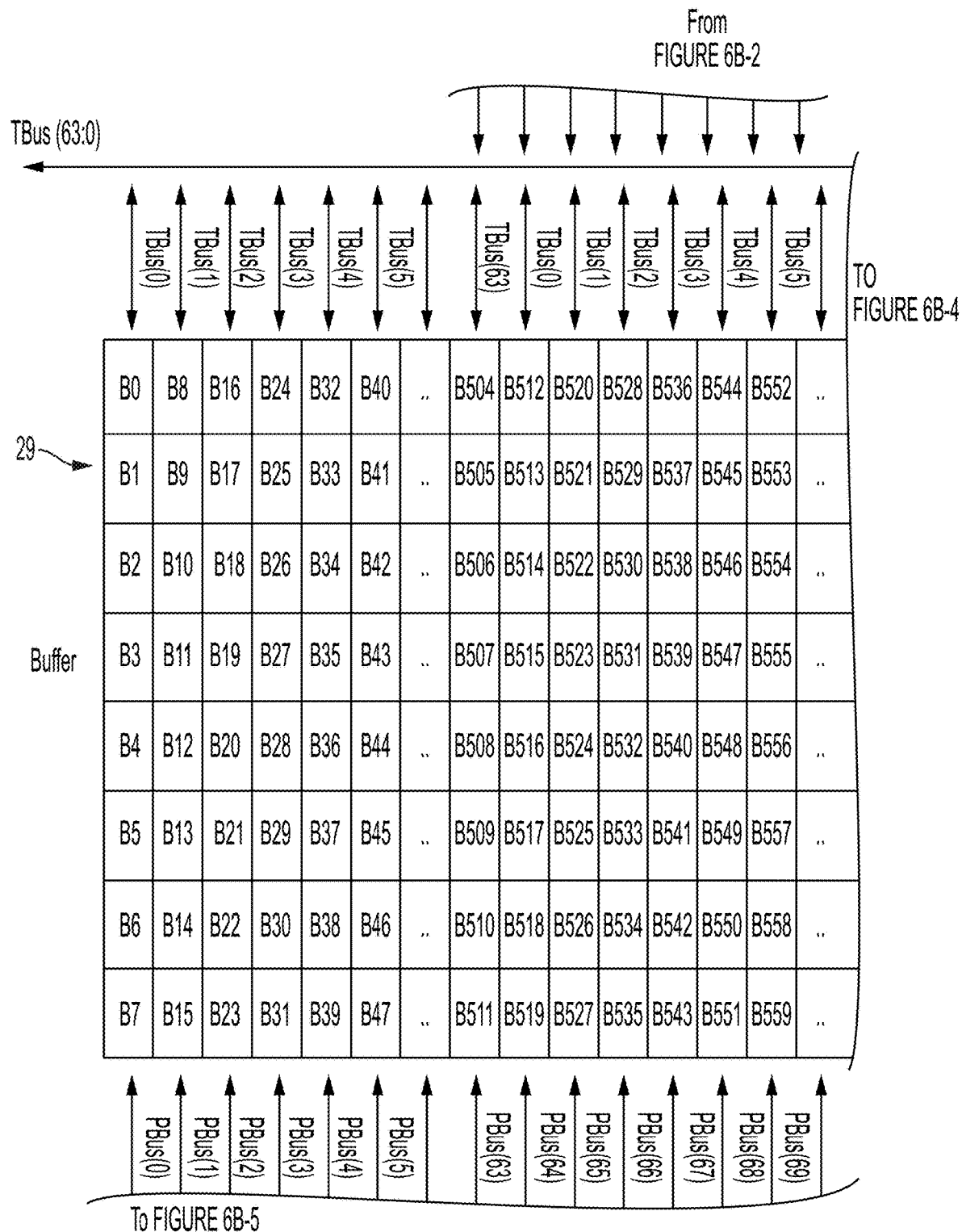
Figures 4, 6B:
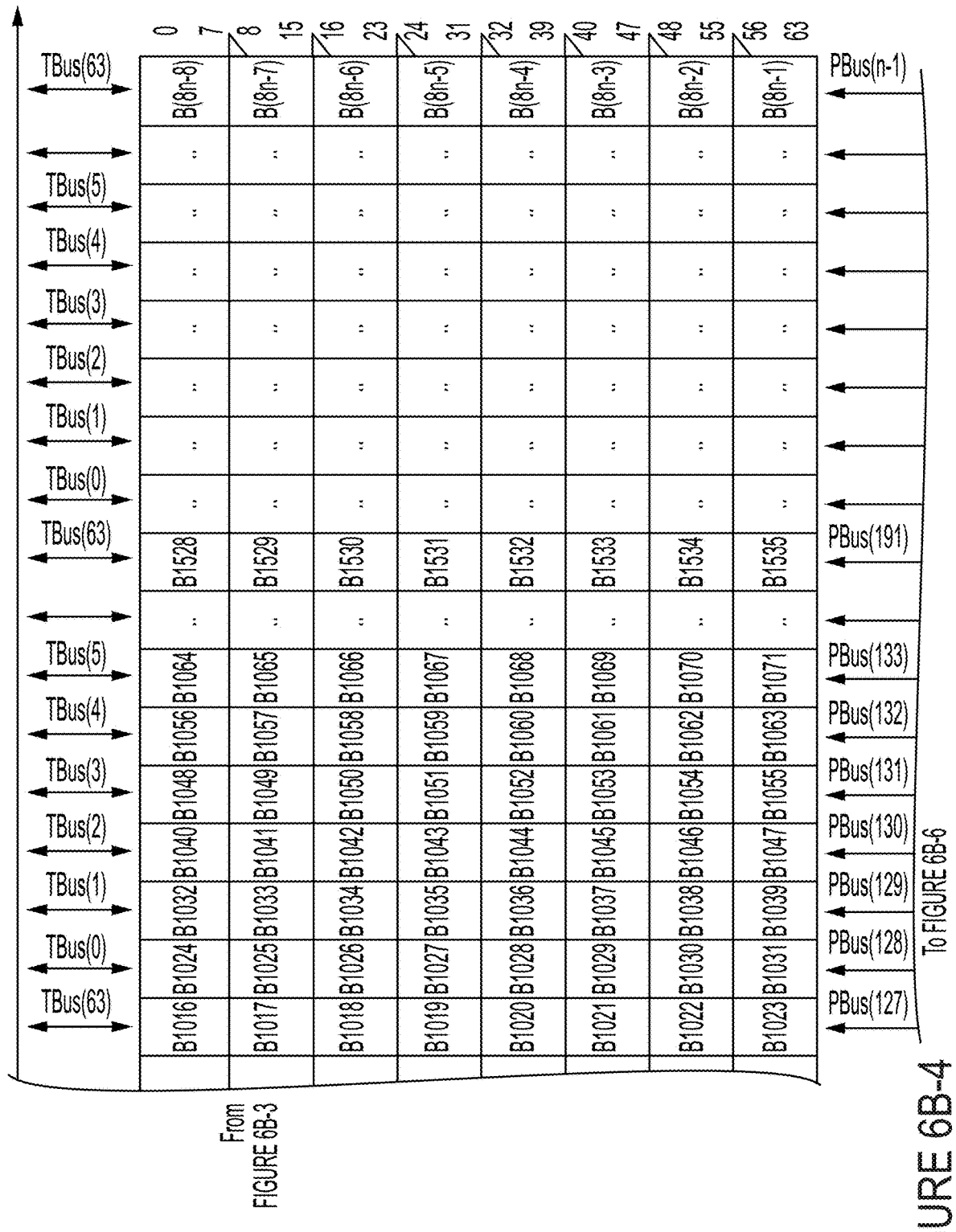
Figures 5, 6B:
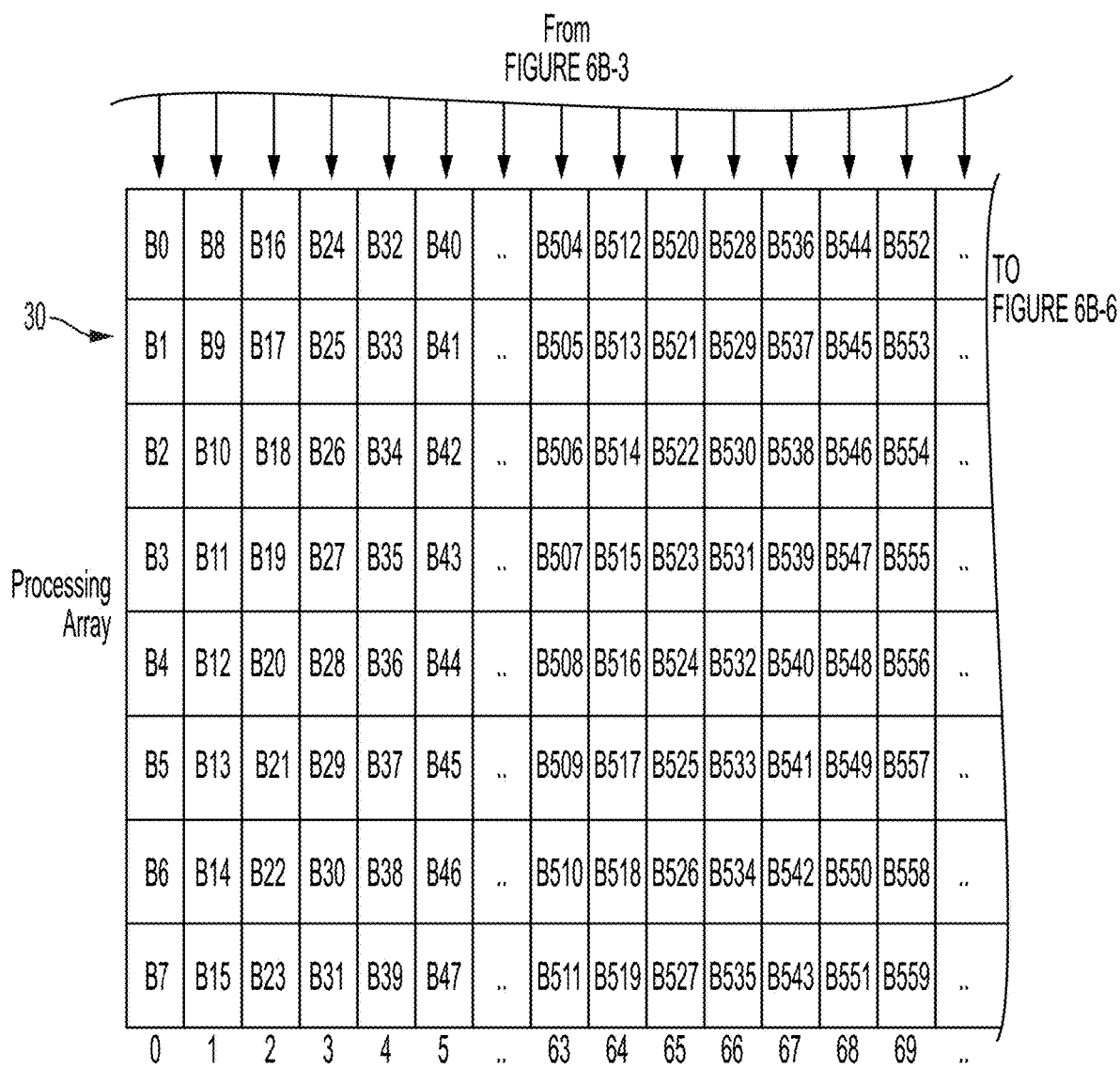

FIG. 5 depicts an exemplary implementation of the transposer 26 from FIG. 2 or 4 constructed as a two-way shift register. The diagram illustrates how data is column-shifted through the transposer during data transfers between it and storage memory, and how data is row-shifted through the transposer during data transfers between it and the processing array. More specifically, FIG. 5 shows the two data buses of FIG. 2 and:

The data byte layout in the transposer after "n" units of 64-bit column data have been transferred from storage memory to the transposer, or after 64 units of n-bit row data have been transferred from the processing array to the transposer.

How column-shifts are used when writing data into the transposer from DBus(63:0), reading data from the transposer onto DBus(63:0), and/or shifting data through the transposer during data transfers between it and storage memory.

How row-shifts are used when writing data into the transposer from TBus(n–1:0), reading data from the transposer onto TBus(n–1:0), and/or shifting data through the transposer during data transfers between it and the processing array.

In the first embodiment, the transposer 26 has the same number of columns as a processing array section. In that case, the column pitch of the transposer should match that of the processing array to allow for a simple data connection between them. However, that may be difficult to implement in some transposer and processing array designs without wasting die area, due to the differences in the circuit design of the two blocks.

A second embodiment described below adds a buffer between the transposer and the processing array with the same number of columns as the processing array and allows for the transposer to have fewer columns than the processing array with no particular column pitch requirements. The second embodiment still eliminates the need for column-addressability in the processing array.

Second Embodiment

A second embodiment implements a second way to orthogonally transpose data during data transfers between storage memory 22 and the processing array 30 by using the transposer 26 and a buffer 29 between them as shown in FIG. 6A. The transposer 26 facilitates the orthogonal data transposition (as in the first embodiment), and the buffer 29 buffers data transfers between the transposer 26 and the processing array 30. In this depiction, a 64-bit data bus, such as Dbus(63:0) for example shown in FIG. 6A, facilitates data transfers between storage memory 22 and the transposer 26, a 64-bit data bus, TBus(63:0) for example shown in FIG. 6A, facilitates data transfers between the transposer 26 and the buffer 29, and an n-bit data bus, PBus(n–1:0) for example shown in FIG. 6A, facilitates data transfers between the buffer 29 and the processing array 30.

Figure 1:
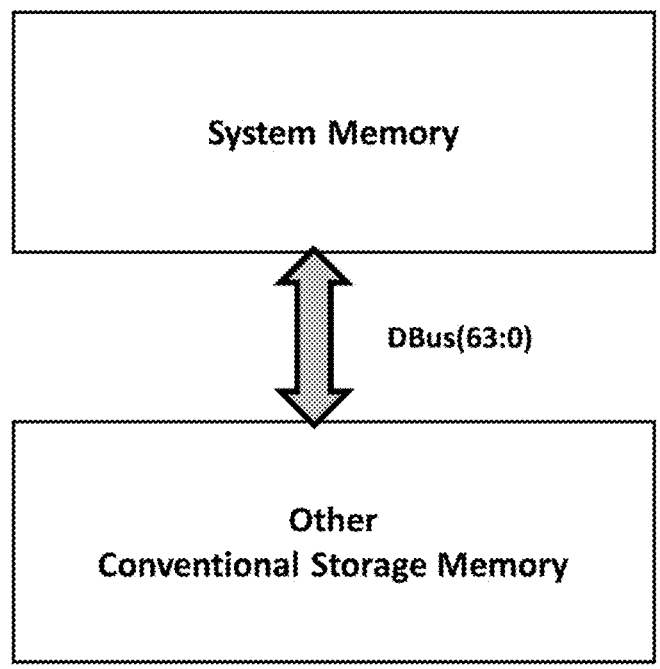
FIG. 1 depicts storage memory connected to other conventional storage memory. In this depiction, a 64-bit data bus facilitates data transfers between the two memory arrays.
Figure 1A:
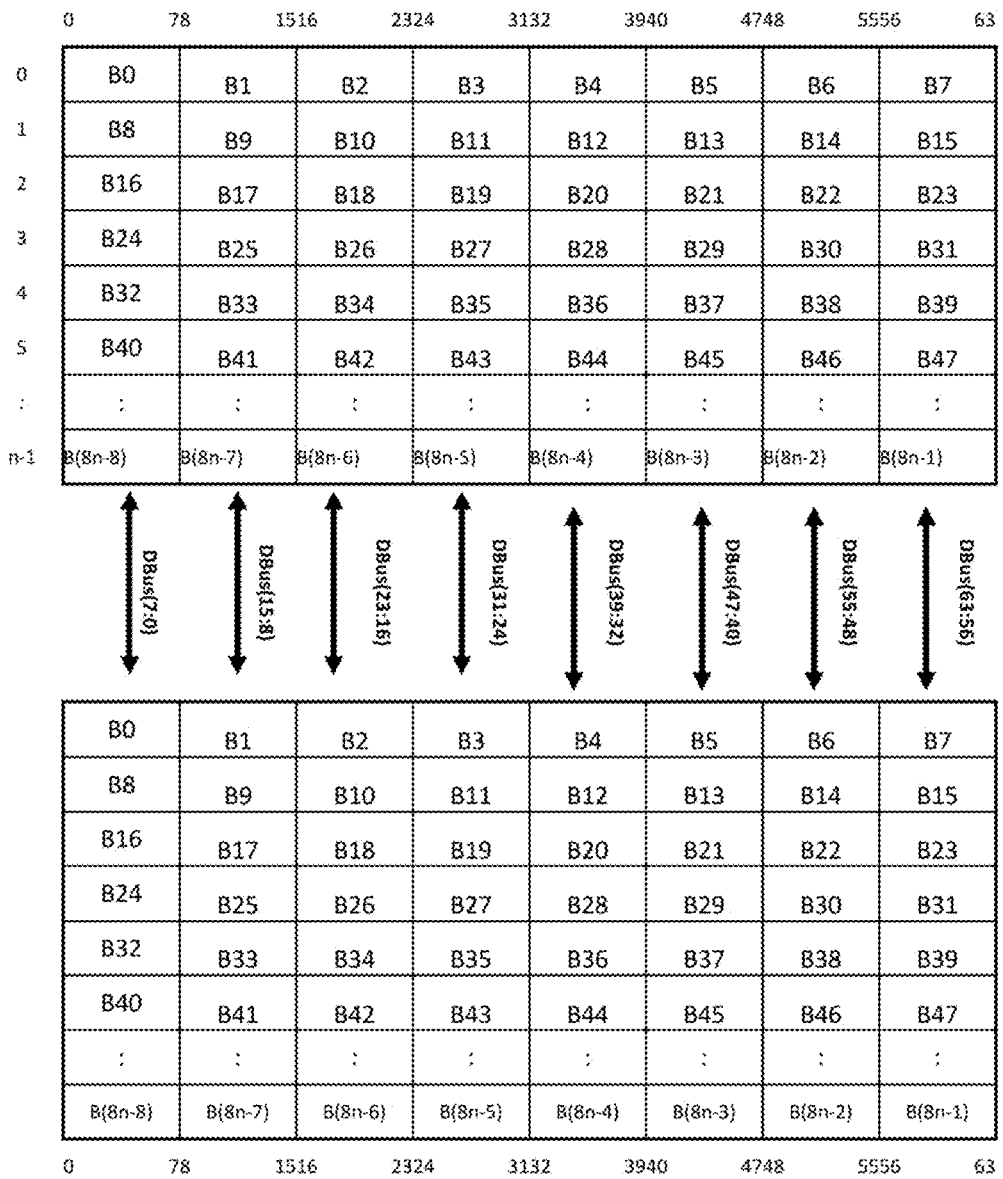
FIG. 1A is an expansion of FIG. 1 that illustrates the data byte layout in storage memory and the other conventional storage memory when data is transferred between them.
Figures 6, 6B:
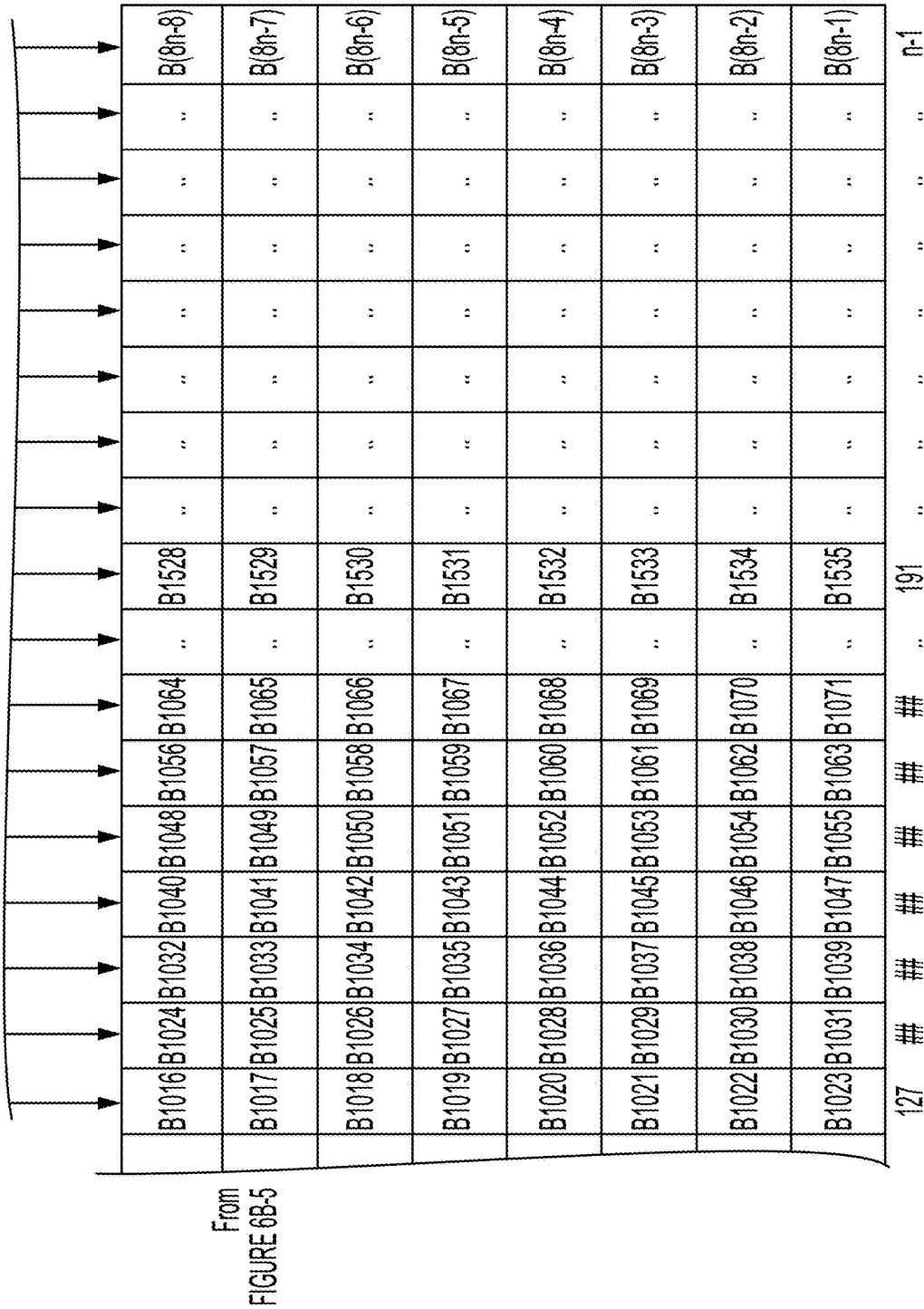

In the second embodiment, the transposer 26 may have fewer columns than the processing array section 30 while the buffer 29 has the same number of columns as a processing array section 30 as shown in FIGS. 6B-1 to 6B-6, thereby eliminating the need for column-addressability in the processing array (as in the first embodiment). The buffer 29 is a simpler circuit than both the transposer 26 and the processing array 30, and therefore easier to implement with the same column pitch as the processing array without wasting die area. In addition, the buffer 29 is a conventional storage circuit (unlike the processing array) so that it is easier to support the column-addressability needed therein to facilitate data transfers between it and the (fewer-column) transposer.

When the transposer 26 and buffer 29 are utilized in this manner, data transfers between storage memory 22 and the processing array 30 are accomplished in three steps:

1. The data transfer between storage memory 22 and the transposer 26.
2. The data transfer between the transposer 26 and the buffer 29.
3. The data transfer between the buffer 29 and the processing array 30.

The execution order of the three steps depends on the direction of data transfer, storage memory→processing array or processing array→storage memory.

Figures 1, 6C:
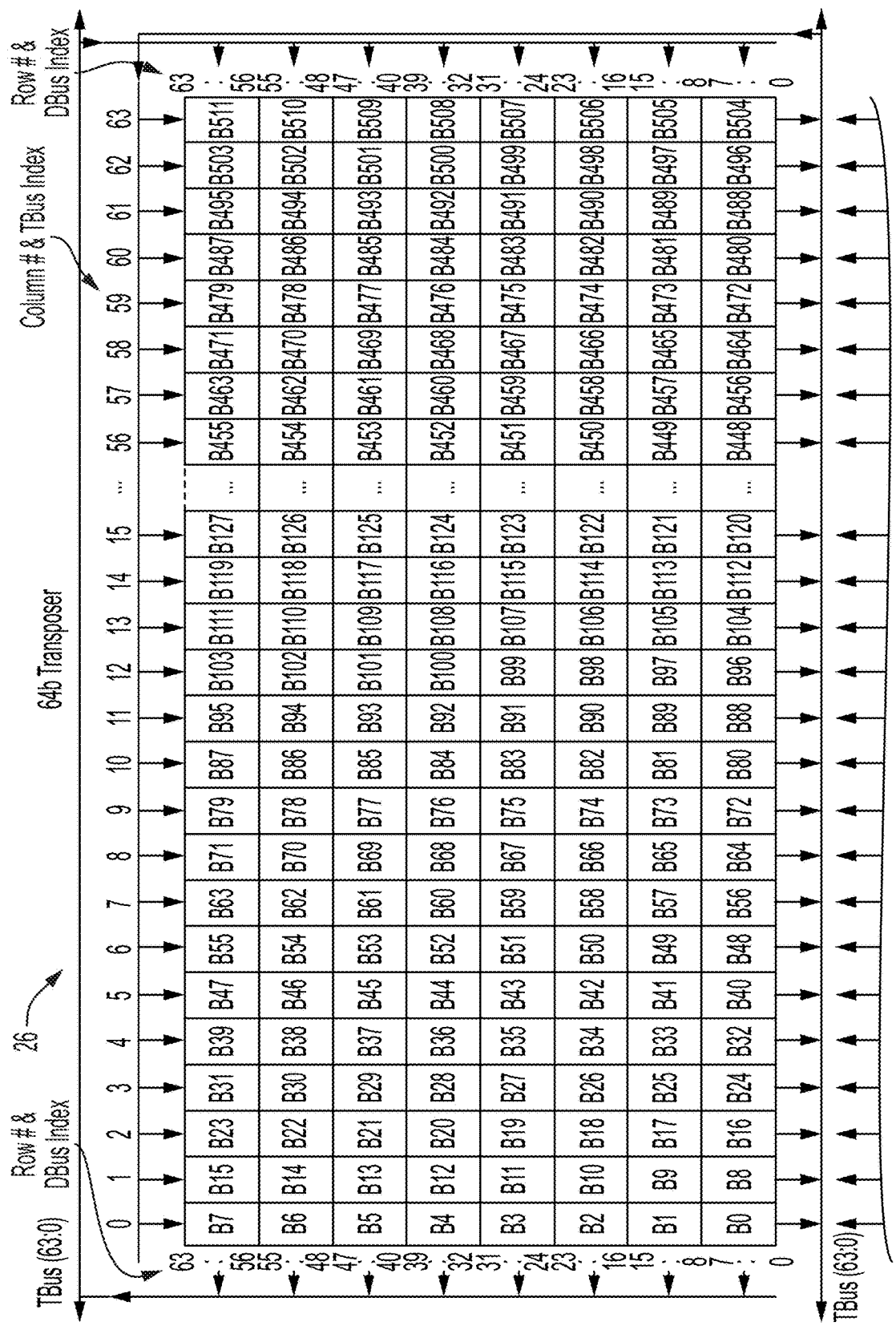

In the second embodiment, as shown in FIGS. 6C-1 to 6C-2, the transposer 26 is constructed as a two-way shift register array with 64 rows (to match the width of the data bus that connects it storage memory, as in the first embodiment) and 64 columns. The number of columns "64" is a whole fraction of the number of columns "n" in the buffer, and establishes the width of the data bus "TBus" that connects the transposer to the buffer. As shown in FIGS. 6C-1 to 6C-2, the buffer 29 is constructed as an array of storage elements with 64 rows to match the number of rows in the transposer 26, and "n" columns to match the number of columns in a processing array section 30 and establish the width of the data bus "PBus" that connects the buffer to the processing array.

During Storage Memory→Processing Array Data Transfers

1. When data is transferred from storage memory to the transposer on a 64-bit data bus "DBus(63:0)", the following occurs simultaneously:

The 64-bit unit of transfer data on DBus(63:0) is stored in column 63, rows 63:0 of the transposer.

The 64-bit units of previously-loaded data in columns 1 through 63 of the transposer are column-shifted to columns 0 through 62.

The 64-bit unit of previously-loaded data in column 0, rows 63:0 of the transposer is discarded.

This procedure repeats until all 64 columns of the transposer have been loaded with storage memory data.

2. When data is subsequently transferred from the transposer to the buffer on a 64-bit data bus "TBus(63:0)", the following occurs simultaneously:

The 64-bit unit of data in row 0, columns 63:0 of the transposer is output to TBus(63:0).

The 64-bit units of data in rows 1 through 63 of the transposer are row-shifted to rows 0 through 62.

The 64-bit unit of data in row 0, columns 63:0 of the transposer is stored in row 63, columns 63:0 in the transposer. This facilitates a "row wrap" feature in the transposer.

This procedure repeats until all 64 rows of transposer data have been transferred to the buffer.

The "row wrap" feature means that after all 64 rows of transposer data have been transferred to the buffer, the transposer contains the same data as it did before the transfer started, as if the transposer data had been copied to the buffer. Such an implementation allows for the same transposer data to be copied to multiple 64-column groups in the buffer and, ultimately, in the processing array, without having to reload the transposer from storage memory each time. This is a desirable feature in some use cases.

3. Data is subsequently transferred from the buffer to the processing array row by row, on an n-bit data bus "PBus (n−1:0)". This is accomplished via conventional means, and beyond the scope of this disclosure.

Steps 1~3 may repeat until storage memory data has been transferred to all "n" columns of the processing array. Step 1 of the next iteration may overlap with step 3 of the previous iteration—i.e. storage memory to transposer transfers may overlap with buffer to processing array transfers.

During Processing Array→Storage Memory Data Transfers

1. Data is initially transferred from the processing array to the buffer row by row, on an n-bit data bus "PBus(n−1:0)". This is accomplished via conventional means, and beyond the scope of this disclosure.

2. When data is subsequently transferred from the buffer to the transposer on a 64-bit data bus "TBus(63:0)", the following occurs simultaneously:

The 64-bit unit of transfer data on TBus(63:0) is stored in row 63, columns 63:0 of the transposer.

The 64-bit units of previously-loaded data in rows 1 through 63 of the transposer are row-shifted to rows 0 through 62.

The 64-bit unit of previously-loaded data in row 0, columns 63:0 of the transposer is discarded.

This procedure repeats until all 64 rows of the transposer have been loaded with processing array data.

3. When data is subsequently transferred from the transposer to storage memory on a 64-bit data bus "DBus(63:0)", the following occurs simultaneously:

The 64-bit unit of data in column 0, rows 63:0 of the transposer is output to DBus(63:0).

The 64-bit units of data in columns 1 through 63 of the transposer are column-shifted to columns 0 through 62.

A logic "0" is stored in column 63, rows 63:0 of the transposer. This is arbitrary—it doesn't matter what data resides in the transposer after it has been transferred to storage memory.

This procedure repeats until all 64 columns of transposer data have been sent to storage memory.

Steps 1~3 may repeat until all "n" columns of processing array data have been transferred to storage memory. Step 1 of the next iteration may overlap with step 3 of the previous iteration—i.e. processing array to buffer transfers may overlap with transposer to storage memory transfers.

Second Embodiment Transposer and Buffer Details

FIGS. 6B-1 to 6B-6 depict the transposer 26 constructed as a 64-row by 64-column array of register bits. FIGS. 6B-1 to 6B-6 illustrates: the initial data byte layout in storage memory, or after "n" units of 64-bit column data have been transferred from the transposer to storage memory; the data byte layout in the transposer after 64 units of 64-bit column data have been transferred from storage memory to the transposer, or after 64 units of 64-bit row data have been transferred from the buffer to the transposer; the data byte layout in the buffer after (n/64)*64 units of 64-bit row data have been transferred from the transposer to the buffer, or after 64 units of n-bit row data have been transferred from the processing array to the buffer; and the data byte layout in the processing array after 64 units of n-bit row data have been transferred from the buffer to the processing array.

FIGS. 6C-1 to 6C-2 depict the transposer implemented as a two-way shift register and illustrates:

The data byte layout in the transposer after 64 units of 64-bit column data have been transferred from storage memory to the transposer, or after 64 units of 64-bit row data have been transferred from the buffer to the transposer.

The data byte layout in the buffer after 64 units of 64-bit row data have been transferred from the transposer to the buffer.

How column-shifts are used when writing data into the transposer from DBus(63:0), reading data from the transposer onto DBus(63:0), and/or shifting data through the transposer during data transfers between it and storage memory.

How row-shifts are used when writing data into the transposer from TBus(63:0), reading data from the transposer onto TBus(63:0), and/or shifting data through the transposer during data transfers between it and the buffer.

Figure 6D:
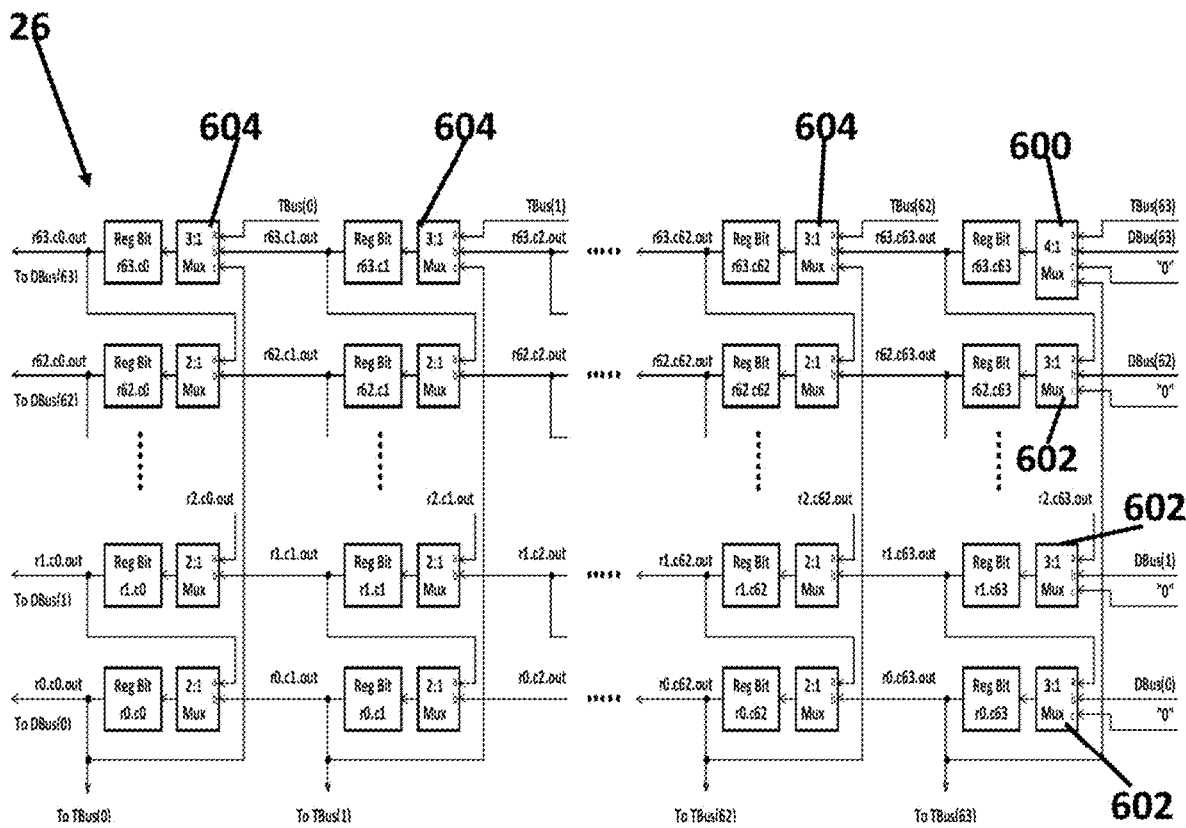
FIG. 6D depicts the detailed circuit implementation of the transposer in FIGS. 6C-1 to 6C-2.

FIG. 6D depicts an example of an implementation of the transposer of the second embodiment with detailed circuit of the transposer in FIGS. 6C-1-6C-2. In this implementation, multiplexers (Muxes) as shown in FIG. 6D are used to select the data input to each register bit in the transposer 26, to facilitate its column-shift and row-shift capabilities. The mux input that is selected as the data input to each register bit depends on whether:

A "column write" is occurring—i.e. a data transfer from storage memory to the transposer.

A "column read" is occurring—i.e. a data transfer from the transposer to storage memory.

A "row write" is occurring—i.e. a data transfer from the buffer to the transposer.

A "row read" is occurring—i.e. a data transfer from the transposer to the buffer.

For example, for row 63, column 63, a 4:1 mux 600 is utilized to select one of four data input sources:

DBus(63) is selected during column write.
A logic "0" is selected during column read.
TBus(63) is selected during row write.
Row 0, column 63 is selected during row read.

For rows 62:0, column 63, a 3:1 mux 602 for each row and column pair is utilized to select one of three data input sources:

For row "x": DBus(x) is selected during column write.
For row "x": a logic "0" is selected during column read.
For row "x": row "x+1", column 63 is selected during row read and row write.

For row 63, columns 62:0, a 3:1 mux 604 for each row and column pair is utilized to select one of three data input sources:

For column "y": row 63, column "y+1" is selected during column write and column read.
For column "y": TBus(m) is selected during row write.
For column "y": row 0, column "y" is selected during row read.

For rows 62:0, columns 62:0, a 2:1 mux for each column and row pair is utilized to select one of two data input sources:

For row "x", column "y": row "x", column "y+1" is selected during column write and column read.
For row "x", column "y": row "x+1", column "y" is selected during row write and row read.

In the first and second embodiments, all 64 bits of data captured in the transposer 26 during any single data transfer from storage memory 22 to the transposer 26 are ultimately stored along the same bit line in the processing array 30. That is desirable if the processing array 30 is used to process 64-bit data words. But if the processing array 30 is used to process, say, 32-bit data words, then it is desirable to be able to store each 32-bit data word captured in the transposer during a sequence of data transfers from storage memory to the transposer in a different bit line in the processing array. That is not possible with the transposers described in the first and second embodiments, because each pair of 32-bit data words comprising the 64 bits of data captured in the transposer during any single data transfer from storage memory to the transposer are ultimately stored along the same bit line in the processing array. However, the below disclosed third, fourth, and fifth embodiments disclose implementations of transposers to transpose 32-bit, 16-bit, and 8-bit data words onto separate bit lines in the processing array when the data bus that connects storage memory to the transposer is 64 bits regardless of the data word size.

Third Embodiment

Figure 7A:
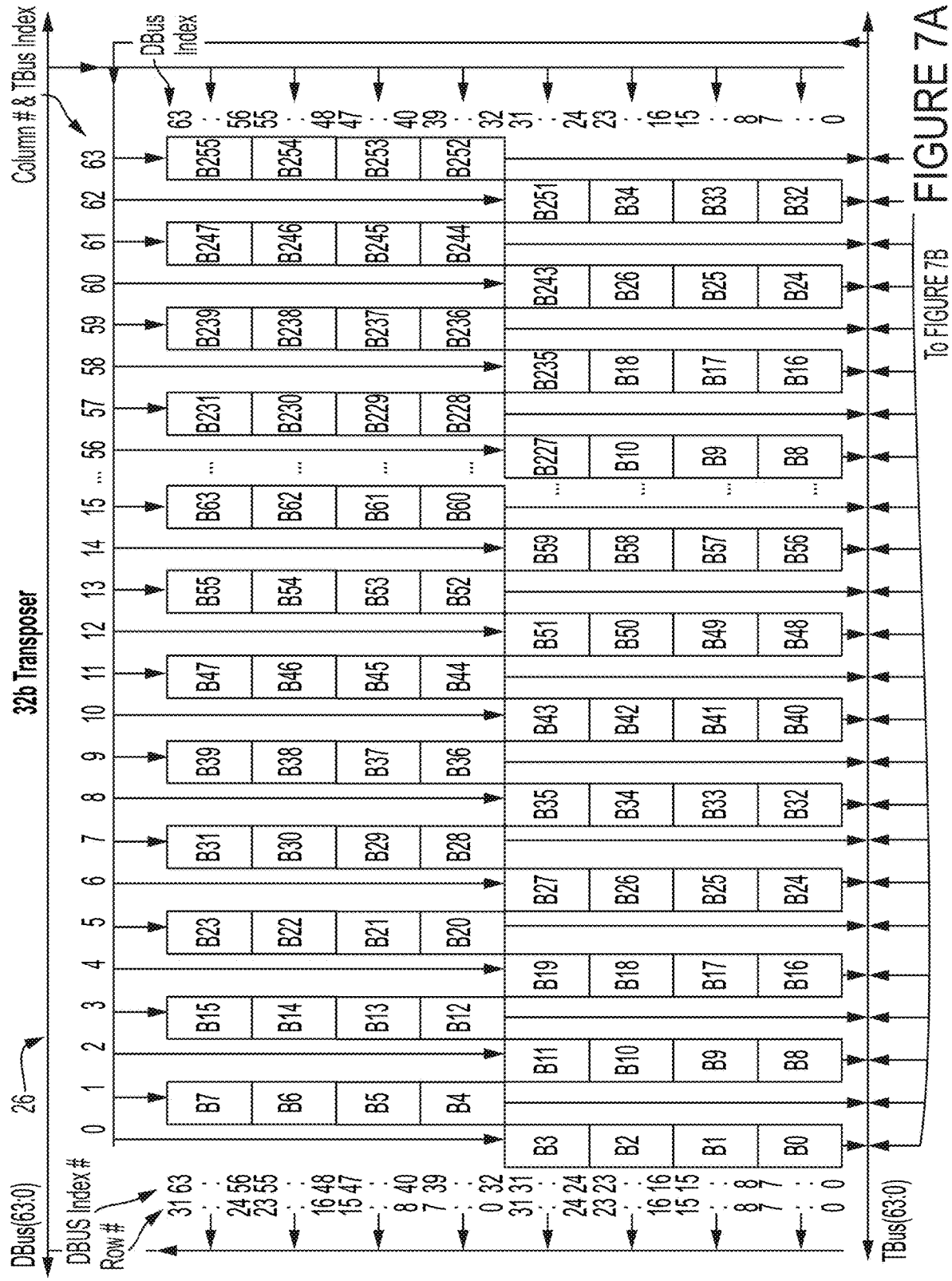
FIGS. 7A and 7B depict an alternate form of the transposer depicted in FIGS. 3a & 3b, constructed as a 32-row by 64-column array of register bits, and as a two-way shift register.
Figure 7B:
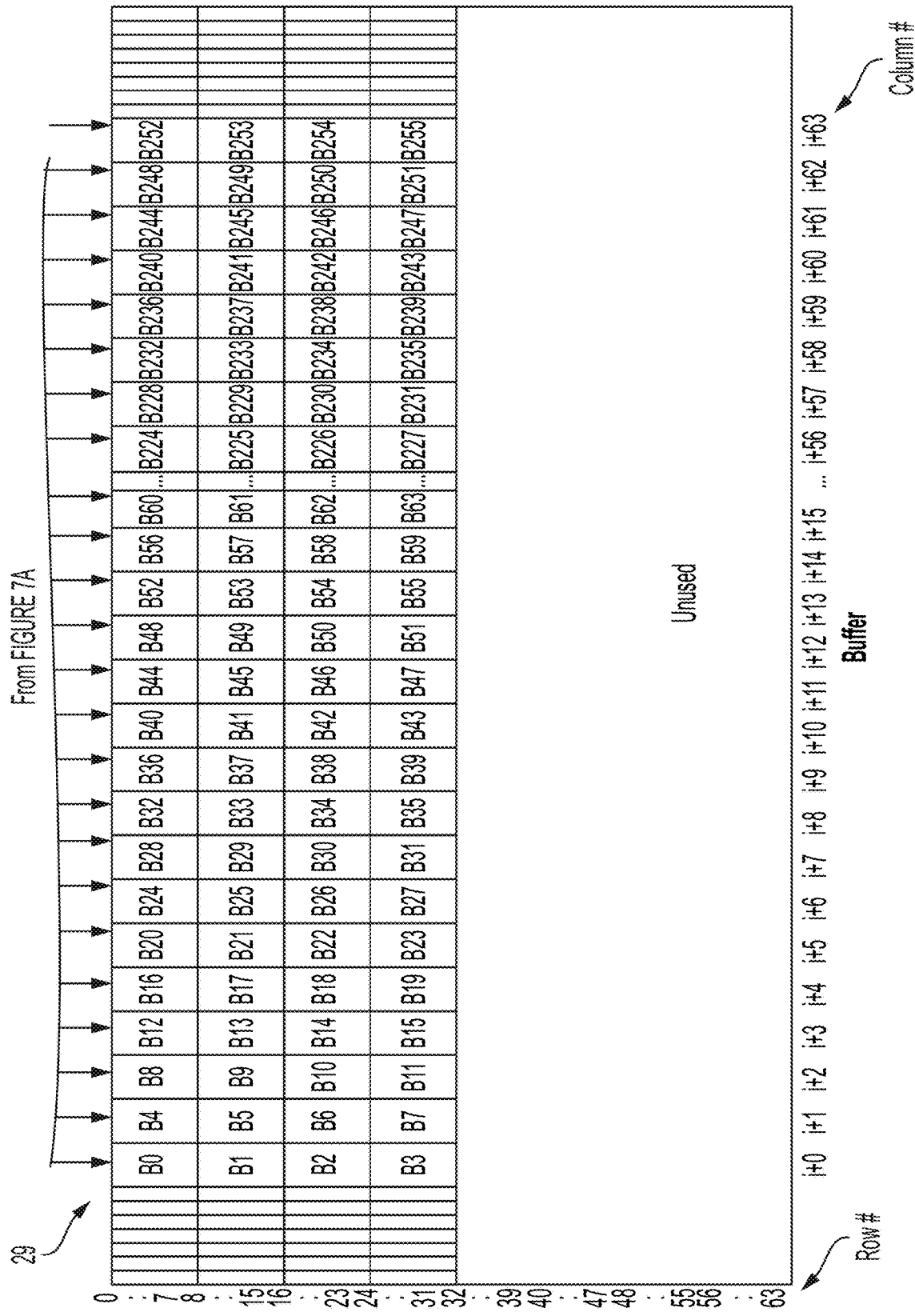

FIGS. 7A and 7B depict an alternate form of the transposer 26 and buffer 29 constructed as a 32-row by 64-column array of register bits and as a two-way shift register. In the third embodiment, as in the second embodiment, a transposer 26 (with fewer columns that the processing array) and a buffer 29 (with the same number of columns as the processing array) are implemented between storage memory 22 and the processing array 30 as shown in FIG. 6A. The difference is that the transposer 26 in the third embodiment is constructed to transpose 32-bit data words onto separate bit lines in the processing array 30 when the data bus that connects storage memory 22 to the transposer 26 remains 64 bits. Specifically, the transposer is constructed as a two-way shift register array with 32 rows (instead of 64 rows) and 64 columns. In addition, a portion of the buffer 29 is unused since the buffer 29 may be used for different embodiments of the transposer shown in FIGS. 6C and 7-9.

During Storage Memory→Processing Array Data Transfers

1. When data is transferred from storage memory to the transposer on a 64-bit data bus "DBus(63:0)", the following occurs simultaneously:

The 32-bit unit of transfer data on DBus(63:32) is stored in column 63, rows 31:0 of the transposer.

The 32-bit unit of transfer data on DBus(31:0) is stored in column 62, rows 31:0 of the transposer.

The 32-bit units of previously-loaded data in columns 3, 5, 7, . . . 63 of the transposer are column-shifted to columns 1, 3, 5, . . . 61.

The 32-bit units of previously-loaded data in columns 2, 4, 6, . . . 62 of the transposer are column-shifted to columns 0, 2, 3, . . . 60.

The 32-bit unit of previously-loaded data in column 1, rows 31:0 of the transposer is discarded.

The 32-bit unit of previously-loaded data in column 0, rows 31:0 of the transposer is discarded.

This procedure repeats until all 64 columns of the transposer have been loaded with storage memory data.

2. When data is subsequently transferred from the transposer to the buffer on a 64-bit data bus "TBus(63:0)", the following occurs simultaneously:

The 64-bit unit of data in row 0, columns 63:0 of the transposer is output to TBus(63:0).

The 64-bit units of data in rows 1 through 31 of the transposer are row-shifted to rows 0 through 30.

The 64-bit unit of data in row 0, columns 63:0 of the transposer is stored in row 31, columns 63:0 in the transposer. This facilitates the "row wrap" feature in the transposer, as in the second embodiment.

This procedure repeats until all 32 rows of transposer data have been transferred to the buffer.

Note that the buffer may still have 64 rows, as in the second embodiment, but only 32 rows are utilized.

3. Data is subsequently transferred from the buffer to the processing array row by row, on an n-bit data bus "PBus(n−1:0)". This is accomplished via conventional means, and beyond the scope of this disclosure.

Steps 1~3 may repeat until storage memory data has been transferred to all "n" columns of the processing array.

During Processing Array→Storage Memory Data Transfers

1. Data is initially transferred from the processing array to the buffer row by row, on an n-bit data bus "PBus(n−1:0)". This is accomplished via conventional means, and beyond the scope of this disclosure.

2. When data is subsequently transferred from the buffer to the transposer on a 64-bit data bus "TBus(63:0)", the following occurs simultaneously:

The 64-bit unit of transfer data on TBus(63:0) is stored in row 31, columns 63:0 of the transposer.

The 64-bit units of previously-loaded data in rows 1 through 31 of the transposer are row-shifted to rows 0 through 30.

The 64-bit unit of previously-loaded data in row 0, columns 63:0 of the transposer is discarded.

This procedure repeats until all 32 rows of the transposer have been loaded with processing array data.

3. When data is subsequently transferred from the transposer to storage memory on a 64-bit data bus "DBus(63:0)", the following occurs simultaneously:

The 32-bit unit of data in column 1, rows 31:0 of the transposer is output to DBus(63:32).

The 32-bit unit of data in column 0, rows 31:0 of the transposer is output to DBus(31:0).

The 32-bit units of data in columns 3, 5, 7, . . . 63 of the transposer are column-shifted to columns 1, 3, 5, . . . 61.

The 32-bit units of data in columns 2, 4, 6, . . . 62 of the transposer are column-shifted to columns 0, 2, 4, . . . 60.

A logic "0" is stored in column 63, rows 31:0 of the transposer.

A logic "0" is stored in column 62, rows 31:0 of the transposer.

This procedure repeats until all 64 columns of transposer data have been sent to storage memory.

Steps 1~3 may repeat until all "n" columns of processing array data have been transferred to storage memory.

FIGS. 7A and 7B depict the transposer constructed as a 32-row by 64-column array of register bits, and as a two-way shift register. It illustrates:

The data byte layout in the transposer after 32 units of 64-bit column data have been transferred from storage memory to the transposer, or after 32 units of 64-bit row data have been transferred from the buffer to the transposer.

The data byte layout in the buffer after 32 units of 64-bit row data have been transferred from the transposer to the buffer.

How column-shifts are used when writing data into the transposer from DBus(63:0), reading data from the transposer onto DBus(63:0), and/or shifting data through the transposer during data transfers between it and storage memory.

How row-shifts are used when writing data into the transposer from TBus(63:0), reading data from the transposer onto TBus(63:0), and/or shifting data through the transposer during data transfers between it and the buffer.

Fourth Embodiment

Figure 8A:
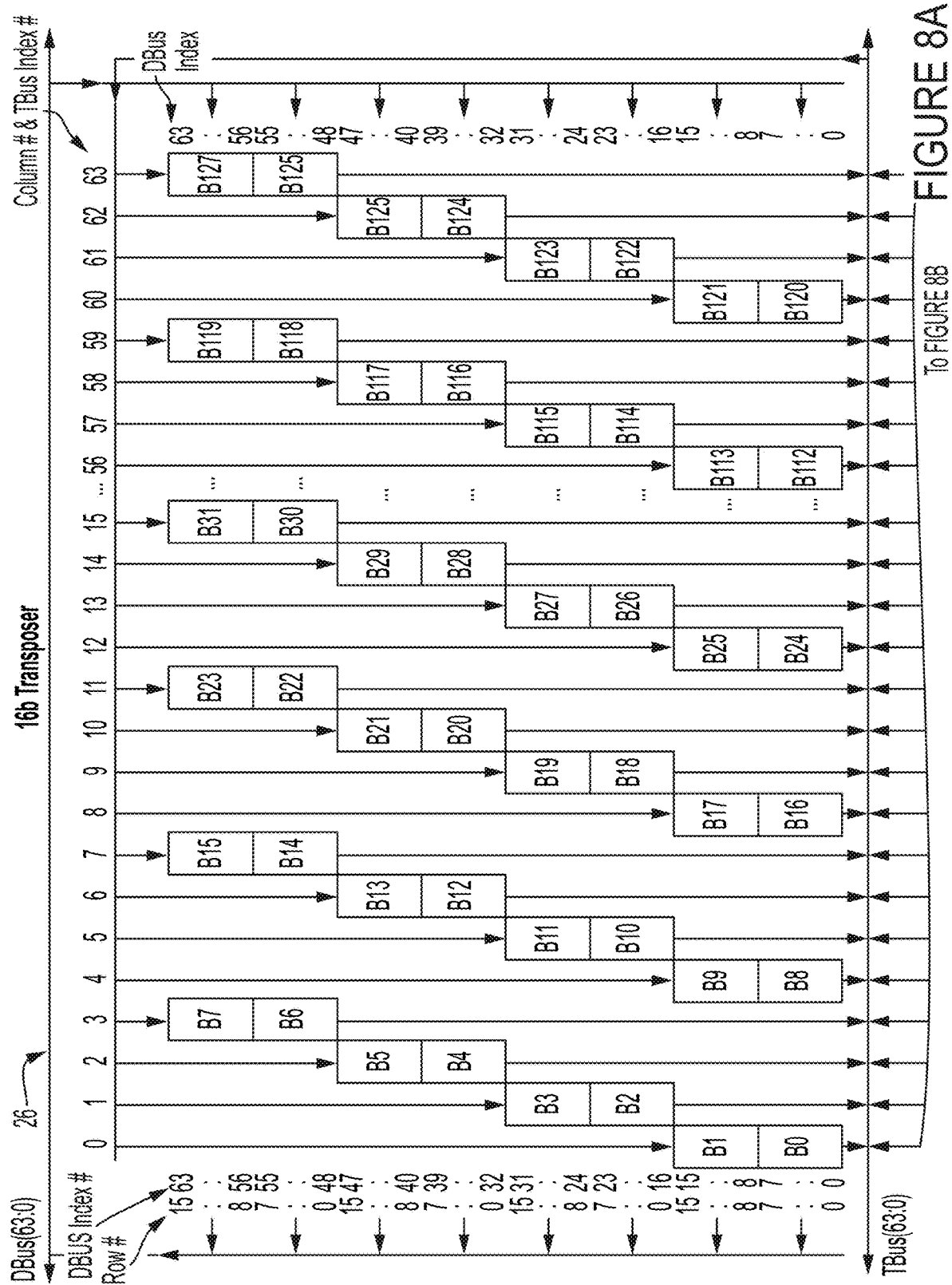
FIGS. 8A and 8B depict an alternate form of the transposer depicted in FIGS. 5 and 6C, constructed as a 16-row by 64-column array of register bits, and as a two-way shift register.
Figure 8B:
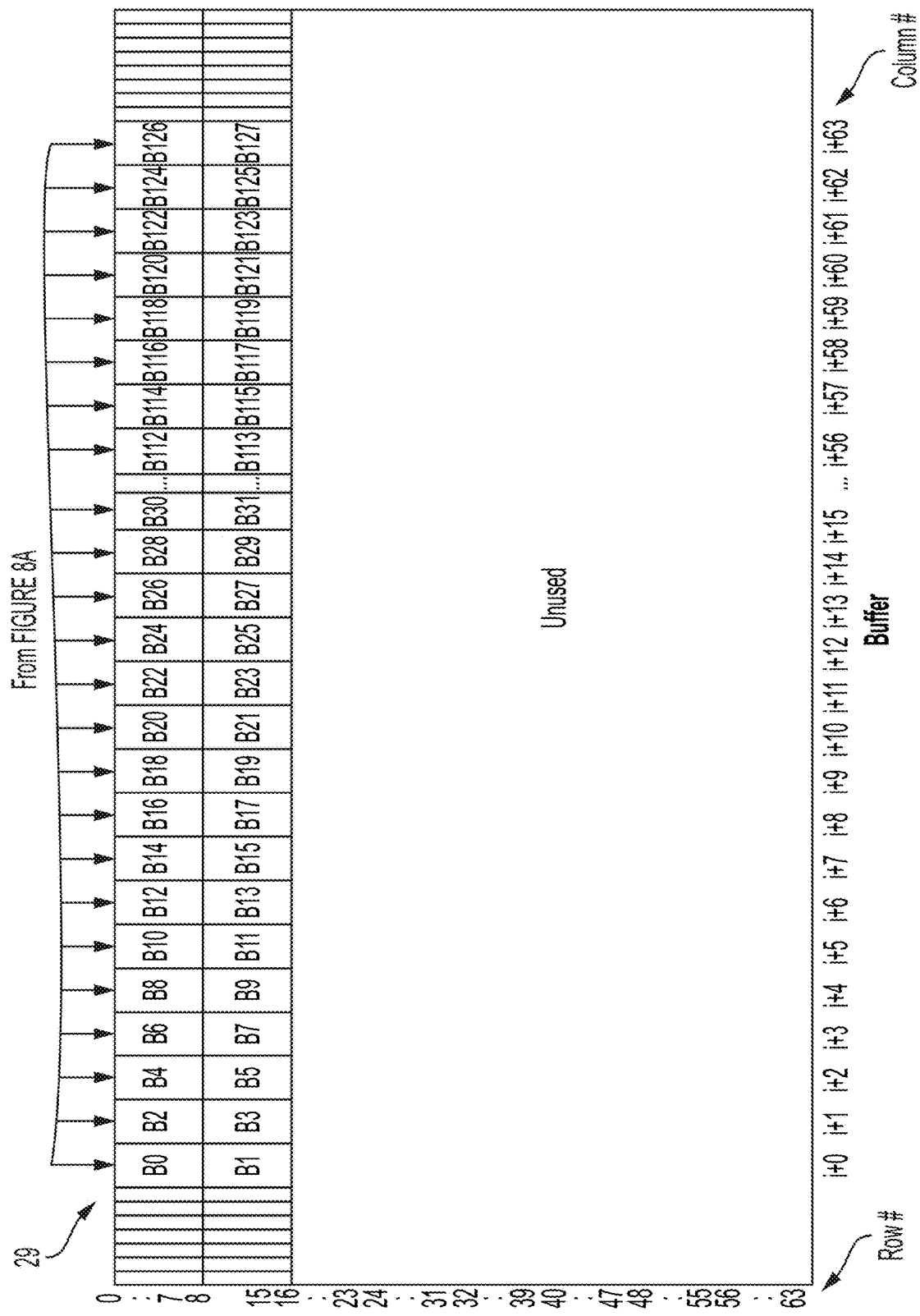

FIGS. 8A and 8B depict an alternate form of the transposer depicted in FIGS. 5 and 6C, constructed as a 16-row by 64-column array of register bits, and as a two-way shift register. In the fourth embodiment, as in the second embodiment, a transposer (with fewer columns that the processing array) and a buffer (with the same number of columns as the processing array) are implemented between storage memory and the processing array. The difference is, the transposer in the fourth embodiment is constructed to transpose 16-bit data words onto separate bit lines in the processing array when the data bus that connects storage memory to the transposer remains 64 bits. Specifically, the transposer is constructed as a two-way shift register array with 16 rows (instead of 64 rows) and 64 columns. In addition, a larger portion of the buffer 29 is unused than with the third embodiment since this embodiment is 16 bits instead of 32 bits.

During Storage Memory→Processing Array Data Transfers

1. When data is transferred from storage memory to the transposer on a 64-bit data bus "DBus(63:0)", the following occurs simultaneously:

The 16-bit unit of transfer data on DBus(63:48) is stored in column 63, rows 15:0 of the transposer.

The 16-bit unit of transfer data on DBus(47:32) is stored in column 62, rows 15:0 of the transposer.

The 16-bit unit of transfer data on DBus(31:16) is stored in column 61, rows 15:0 of the transposer.

The 16-bit unit of transfer data on DBus(15:0) is stored in column 60, rows 15:0 of the transposer.

The 16-bit units of previously-loaded data in columns 7, 11, 15, . . . 63 of the transposer are column-shifted to columns 3, 7, 11, . . . 59.

The 16-bit units of previously-loaded data in columns 6, 10, 14, . . . 62 of the transposer are column-shifted to columns 2, 6, 10, . . . 58.

The 16-bit units of previously-loaded data in columns 5, 9, 13, . . . 61 of the transposer are column-shifted to columns 1, 5, 9, . . . 57.

The 16-bit units of previously-loaded data in columns 4, 8, 12, . . . 60 of the transposer are column-shifted to columns 0, 4, 9, . . . 56.

The 16-bit unit of previously-loaded data in column 3, rows 15:0 of the transposer is discarded.

The 16-bit unit of previously-loaded data in column 2, rows 15:0 of the transposer is discarded.

The 16-bit unit of previously-loaded data in column 1, rows 15:0 of the transposer is discarded.

The 16-bit unit of previously-loaded data in column 0, rows 15:0 of the transposer is discarded.

This procedure repeats until all 64 columns of the transposer have been loaded with storage memory data.

2. When data is subsequently transferred from the transposer to the buffer on a 64-bit data bus "TBus(63:0)", the following occurs simultaneously:

The 64-bit unit of data in row 0, columns 63:0 of the transposer is output to TBus(63:0).

The 64-bit units of data in rows 1 through 15 of the transposer are row-shifted to rows 0 through 14.

The 64-bit unit of data in row 0, columns 63:0 of the transposer is stored in row 15, columns 63:0 in the transposer. This facilitates the "row wrap" feature in the transposer, as in the second embodiment.

This procedure repeats until all 16 rows of transposer data have been transferred to the buffer.

Note that the buffer may still have 64 rows, as in the second embodiment, but only 16 rows are utilized.

3. Data is subsequently transferred from the buffer to the processing array row by row, on an n-bit data bus "PBus (n−1:0)". This is accomplished via conventional means, and beyond the scope of this disclosure.

Steps 1~3 may repeat until storage memory data has been transferred to all "n" columns of the processing array.

During Processing Array→Storage Memory Data Transfers

1. Data is initially transferred from the processing array to the buffer row by row, on an n-bit data bus "PBus(n−1:0)". This is accomplished via conventional means, and beyond the scope of this disclosure.

2. When data is subsequently transferred from the buffer to the transposer on a 64-bit data bus "TBus(63:0)", the following occurs simultaneously:

The 64-bit unit of transfer data on TBus(63:0) is stored in row 15, columns 63:0 of the transposer.

The 64-bit units of previously-loaded data in rows 1 through 15 of the transposer are row-shifted to rows 0 through 14.

The 64-bit unit of previously-loaded data in row 0, columns 63:0 of the transposer is discarded.

This procedure repeats until all 16 rows of the transposer have been loaded with processing array data.

3. When data is subsequently transferred from the transposer to storage memory on a 64-bit data bus "DBus(63:0)", the following occurs simultaneously:

The 16-bit unit of data in column 3, rows 15:0 of the transposer is output to DBus(63:48).

The 16-bit unit of data in column 2, rows 15:0 of the transposer is output to DBus(47:32).

The 16-bit unit of data in column 1, rows 15:0 of the transposer is output to DBus(31:16).

The 16-bit unit of data in column 0, rows 15:0 of the transposer is output to DBus(15:0).

The 16-bit units of data in columns 7, 11, 15, . . . 63 of the transposer are column-shifted to columns 3, 7, 11, . . . 59.

The 16-bit units of data in columns 6, 10, 14, . . . 62 of the transposer are column-shifted to columns 2, 6, 10, . . . 58.

The 16-bit units of data in columns 5, 9, 13, . . . 61 of the transposer are column-shifted to columns 1, 5, 9, . . . 57.

The 16-bit units of data in columns 4, 8, 12, . . . 60 of the transposer are column-shifted to columns 0, 4, 9, . . . 56.

A logic "0" is stored in column 63, rows 15:0 of the transposer.

A logic "0" is stored in column 62, rows 15:0 of the transposer.

A logic "0" is stored in column 61, rows 15:0 of the transposer.

A logic "0" is stored in column 60, rows 15:0 of the transposer.

This procedure repeats until all 64 columns of transposer data have been sent to storage memory.

Steps 1~3 may repeat until all "n" columns of processing array data have been transferred to storage memory.

Fifth Embodiment

Figure 9A:
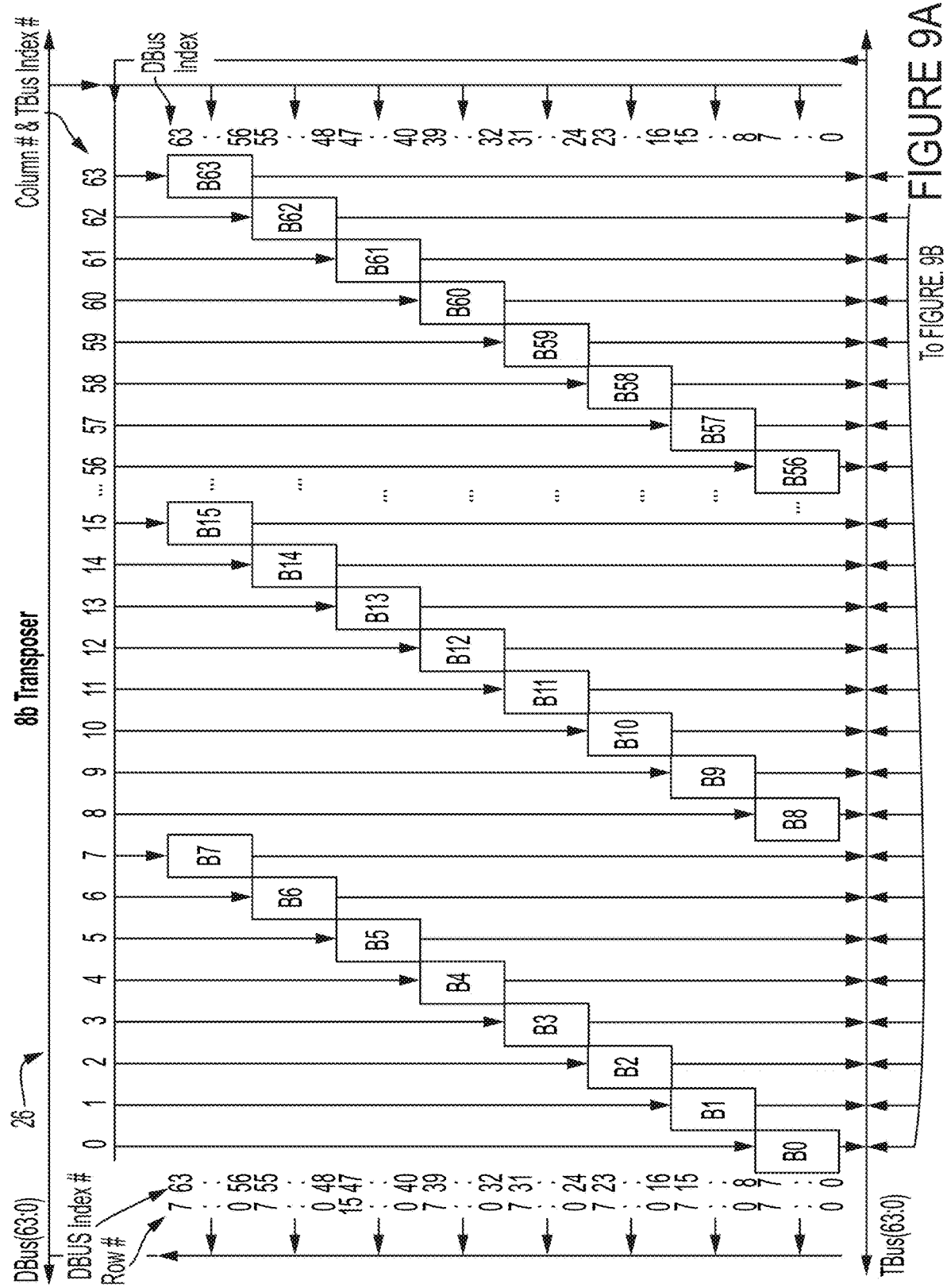
FIGS. 9A and 9B depict an alternate form of the transposer depicted in FIGS. 5 and 6C, constructed as an 8-row by 64-column array of register bits, and as a two-way shift register.
Figure 9B:
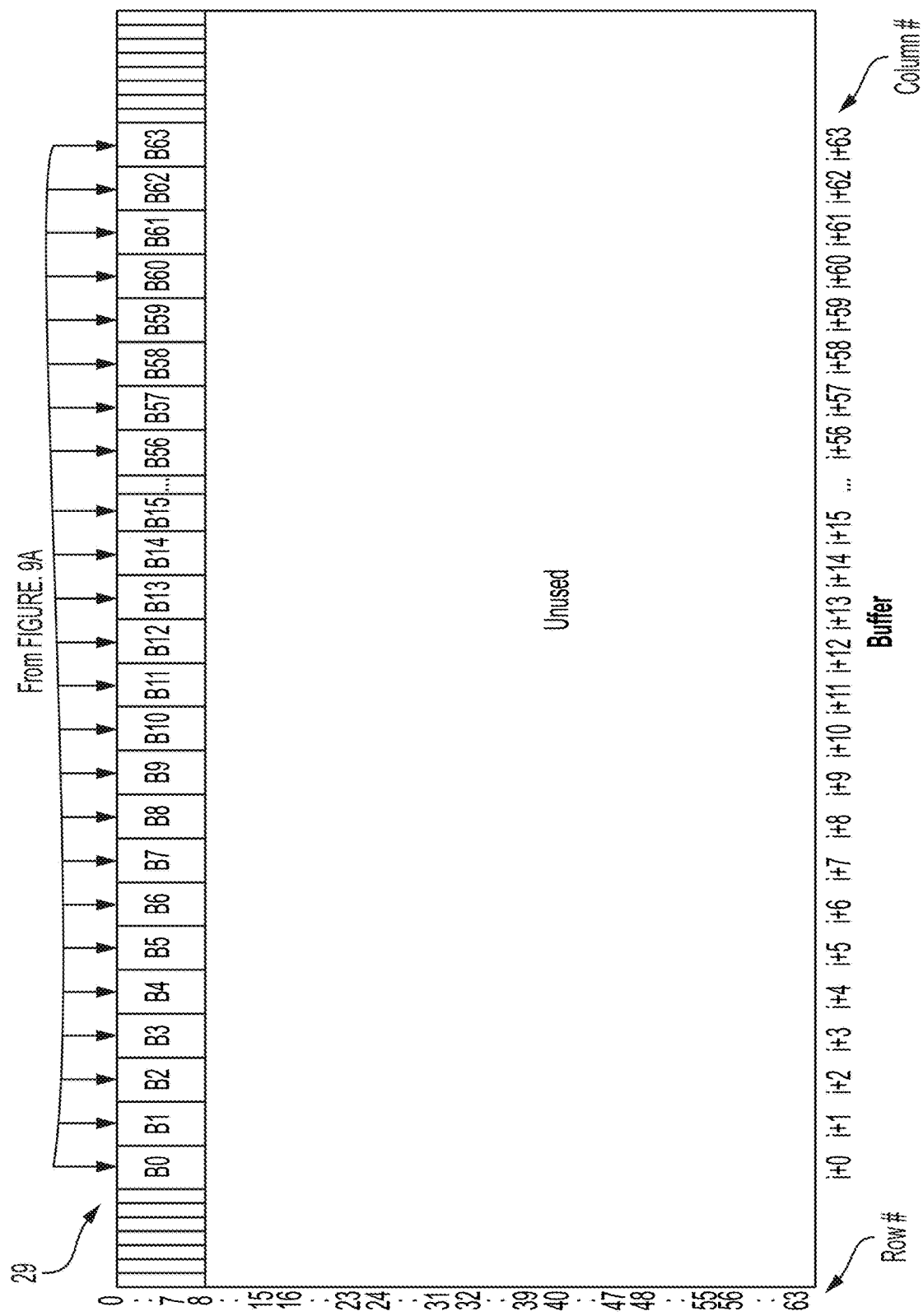

FIGS. 9A and 9B depict an alternate form of the transposer depicted in FIGS. 5 and 6C, constructed as an 8-row by 64-column array of register bits, and as a two-way shift register. In the fifth embodiment, as in the second embodiment, a transposer (with fewer columns that the processing array) and a buffer (with the same number of columns as the processing array) are implemented between storage memory and the processing array. The difference is, the transposer in the fifth embodiment is constructed to transpose 8-bit data words onto separate bit lines in the processing array when the data bus that connects storage memory to the transposer remains 64 bits. Specifically, the transposer is constructed as a two-way shift register array with 8 rows (instead of 64 rows) and 64 columns. In addition, a still larger portion of the buffer 29 is unused than with the third or fourth embodiments since this embodiment is 8 bits instead of 32 bits or 16 bits.

During Storage Memory→Processing Array Data Transfers

1. When data is transferred from storage memory to the transposer on a 64-bit data bus "DBus(63:0)", the following occurs simultaneously:

The 8-bit unit of transfer data on DBus(63:56) is stored in column 63, rows 7:0 of the transposer.

The 8-bit unit of transfer data on DBus(55:48) is stored in column 62, rows 7:0 of the transposer.

The 8-bit unit of transfer data on DBus(47:40) is stored in column 61, rows 7:0 of the transposer.

The 8-bit unit of transfer data on DBus(39:32) is stored in column 60, rows 7:0 of the transposer.

The 8-bit unit of transfer data on DBus(31:24) is stored in column 59, rows 7:0 of the transposer.

The 8-bit unit of transfer data on DBus(23:16) is stored in column 58, rows 7:0 of the transposer.

The 8-bit unit of transfer data on DBus(15:8) is stored in column 57, rows 7:0 of the transposer.

The 8-bit unit of transfer data on DBus(7:0) is stored in column 56, rows 7:0 of the transposer.

The 8-bit units of previously-loaded data in columns 15, 23, 31, . . . 63 of the transposer are column-shifted to columns 7, 15, 23, . . . 55.

The 8-bit units of previously-loaded data in columns 14, 22, 30, . . . 62 of the transposer are column-shifted to columns 6, 14, 22, . . . 54.

The 8-bit units of previously-loaded data in columns 13, 21, 29, . . . 61 of the transposer are column-shifted to columns 5, 13, 21, . . . 53.

The 8-bit units of previously-loaded data in columns 12, 20, 28, . . . 60 of the transposer are column-shifted to columns 4, 12, 20, . . . 52.

The 8-bit units of previously-loaded data in columns 11, 19, 27, . . . 59 of the transposer are column-shifted to columns 3, 11, 19, . . . 51.

The 8-bit units of previously-loaded data in columns 10, 18, 26, . . . 58 of the transposer are column-shifted to columns 2, 10, 18, . . . 50.

The 8-bit units of previously-loaded data in columns 9, 17, 25, . . . 57 of the transposer are column-shifted to columns 1, 9, 17, . . . 49.

The 8-bit units of previously-loaded data in columns 8, 16, 24, . . . 56 of the transposer are column-shifted to columns 0, 8, 16, . . . 48.

The 8-bit unit of previously-loaded data in column 7, rows 7:0 of the transposer is discarded.

The 8-bit unit of previously-loaded data in column 6, rows 7:0 of the transposer is discarded.

The 8-bit unit of previously-loaded data in column 5, rows 7:0 of the transposer is discarded.

The 8-bit unit of previously-loaded data in column 4, rows 7:0 of the transposer is discarded.

The 8-bit unit of previously-loaded data in column 3, rows 7:0 of the transposer is discarded.

The 8-bit unit of previously-loaded data in column 2, rows 7:0 of the transposer is discarded.

The 8-bit unit of previously-loaded data in column 1, rows 7:0 of the transposer is discarded.

The 8-bit unit of previously-loaded data in column 0, rows 7:0 of the transposer is discarded.

This procedure repeats until all 64 columns of the transposer have been loaded with storage memory data.

2. When data is subsequently transferred from the transposer to the buffer on a 64-bit data bus "TBus(63:0)", the following occurs simultaneously:

The 64-bit unit of data in row 0, columns 63:0 of the transposer is output to TBus(63:0).

The 64-bit units of data in rows 1 through 7 of the transposer are row-shifted to rows 0 through 6.

The 64-bit unit of data in row 0, columns 63:0 of the transposer is stored in row 7, columns 63:0 in the transposer. This facilitates the "row wrap" feature in the transposer, as in the second embodiment.

This procedure repeats until all 8 rows of transposer data have been transferred to the buffer. Note that the buffer may still have 64 rows, as in the second embodiment, but only 8 rows are utilized.

3. Data is subsequently transferred from the buffer to the processing array row by row, on an n-bit data bus "PBus (n−1:0)". This is accomplished via conventional means, and beyond the scope of this disclosure.

Steps 1~3 may repeat until storage memory data has been transferred to all "n" columns of the processing array.

During Processing Array→Storage Memory Data Transfers

1. Data is initially transferred from the processing array to the buffer row by row, on an n-bit data bus "PBus(n−1:0)". This is accomplished via conventional means, and beyond the scope of this disclosure.

2. When data is subsequently transferred from the buffer to the transposer on a 64-bit data bus "TBus(63:0)", the following occurs simultaneously:

The 64-bit unit of transfer data on TBus(63:0) is stored in row 7, columns 63:0 of the transposer.

The 64-bit units of previously-loaded data in rows 1 through 7 of the transposer are row-shifted to rows 0 through 6.

The 64-bit unit of previously-loaded data in row 0, columns 63:0 of the transposer is discarded.

This procedure repeats until all 8 rows of the transposer have been loaded with processing array data.

3. When data is subsequently transferred from the transposer to storage memory on a 64-bit data bus "DBus(63:0)", the following occurs simultaneously:

The 8-bit unit of data in column 7, rows 7:0 of the transposer is output to DBus(63:56).

The 8-bit unit of data in column 6, rows 7:0 of the transposer is output to DBus(55:48).

The 8-bit unit of data in column 5, rows 7:0 of the transposer is output to DBus(47:40).

The 8-bit unit of data in column 4, rows 7:0 of the transposer is output to DBus(39:32).

The 8-bit unit of data in column 3, rows 7:0 of the transposer is output to DBus(31:24).

The 8-bit unit of data in column 2, rows 7:0 of the transposer is output to DBus(23:16).

The 8-bit unit of data in column 1, rows 7:0 of the transposer is output to DBus(15:8).

The 8-bit unit of data in column 0, rows 7:0 of the transposer is output to DBus(7:0).

The 8-bit units of data in columns 15, 23, 31, . . . 63 of the transposer are column-shifted to columns 7, 15, 23, . . . 55.

The 8-bit units of data in columns 14, 22, 30, . . . 62 of the transposer are column-shifted to columns 6, 14, 22, . . . 54.

The 8-bit units of data in columns 13, 21, 29, . . . 61 of the transposer are column-shifted to columns 5, 13, 21, . . . 53.

The 8-bit units of data in columns 12, 20, 28, . . . 60 of the transposer are column-shifted to columns 4, 12, 0, . . . 52.

The 8-bit units of data in columns 11, 19, 27, . . . 59 of the transposer are column-shifted to columns 3, 11, 19, . . . 51.

The 8-bit units of data in columns 10, 18, 26, . . . 58 of the transposer are column-shifted to columns 2, 10, 18, . . . 50.

The 8-bit units of data in columns 9, 17, 25, . . . 57 of the transposer are column-shifted to columns 1, 9, 17, . . . 49.

The 8-bit units of data in columns 8, 16, 24, . . . 56 of the transposer are column-shifted to columns 0, 8, 16, . . . 48.

A logic "0" is stored in column 63, rows 7:0 of the transposer.

A logic "0" is stored in column 62, rows 7:0 of the transposer.

A logic "0" is stored in column 61, rows 7:0 of the transposer.

A logic "0" is stored in column 60, rows 7:0 of the transposer.

A logic "0" is stored in column 59, rows 7:0 of the transposer.

A logic "0" is stored in column 58, rows 7:0 of the transposer.

A logic "0" is stored in column 57, rows 7:0 of the transposer.

A logic "0" is stored in column 56, rows 7:0 of the transposer.

This procedure repeats until all 64 columns of transposer data have been sent to storage memory.

Steps 1~3 may repeat until all "n" columns of processing array data have been transferred to storage memory.

The multiple embodiments of the transposers 26 (e.g. embodiments 2, 3, 4, and 5) may be implemented in a single design in which a processing array is implemented. In this case only one transposer is enabled/selected during any particular storage memory <-> processing array data transfer.

The foregoing description, for purpose of explanation, has been described with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the disclosure and its practical applications, to thereby enable others skilled in the art to best utilize the disclosure and various embodiments with various modifications as are suited to the particular use contemplated.

The system and method disclosed herein may be implemented via one or more components, systems, servers, appliances, other subcomponents, or distributed between such elements. When implemented as a system, such systems may include an/or involve, inter alia, components such as software modules, general-purpose CPU, RAM, etc. found in general-purpose computers. In implementations where the innovations reside on a server, such a server may include or involve components such as CPU, RAM, etc., such as those found in general-purpose computers.

Additionally, the system and method herein may be achieved via implementations with disparate or entirely different software, hardware and/or firmware components, beyond that set forth above. With regard to such other components (e.g., software, processing components, etc.) and/or computer-readable media associated with or embodying the present inventions, for example, aspects of the innovations herein may be implemented consistent with numerous general purpose or special purpose computing systems or configurations. Various exemplary computing systems, environments, and/or configurations that may be suitable for use with the innovations herein may include, but are not limited to: software or other components within or embodied on personal computers, servers or server computing devices such as routing/connectivity components, handheld or laptop devices, multiprocessor systems, microprocessor-based systems, set top boxes, consumer electronic devices, network PCs, other existing computer platforms, distributed computing environments that include one or more of the above systems or devices, etc.

In some instances, aspects of the system and method may be achieved via or performed by logic and/or logic instructions including program modules, executed in association with such components or circuitry, for example. In general, program modules may include routines, programs, objects, components, data structures, etc. that perform particular tasks or implement particular instructions herein. The inventions may also be practiced in the context of distributed software, computer, or circuit settings where circuitry is connected via communication buses, circuitry or links. In distributed settings, control/instructions may occur from both local and remote computer storage media including memory storage devices.

The software, circuitry and components herein may also include and/or utilize one or more type of computer readable media. Computer readable media can be any available media that is resident on, associable with, or can be accessed by such circuits and/or computing components. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules and/or other components. Further, communication media may include wired media such as a wired network or direct-wired connection, however no media of any such type herein includes transitory media. Combinations of the any of the above are also included within the scope of computer readable media.

In the present description, the terms component, module, device, etc. may refer to any type of logical or functional software elements, circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive, etc.) to be read by a central processing unit to implement the functions of the innovations herein. Or, the modules can comprise programming instructions transmitted to a general purpose computer or to processing/graphics hardware via a transmission carrier wave. Also, the modules can be implemented as hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, features consistent with the disclosure may be implemented via computer-hardware, software and/or firmware. For example, the systems and methods disclosed herein may be embodied in various forms including, for example, a data processor, such as a computer that also includes a database, digital electronic circuitry, firmware, software, or in combinations of them. Further, while some of the disclosed implementations describe specific hardware components, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may also be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) though again does not include transitory media. Unless the context clearly requires otherwise, throughout the description, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the invention pertains that variations and modifications of the various implementations shown and described herein may be made without departing from the spirit and scope of the invention. Accordingly, it is intended that the invention be limited only to the extent required by the applicable rules of law.

While the foregoing has been with reference to a particular embodiment of the disclosure, it will be appreciated by those skilled in the art that changes in this embodiment may be made without departing from the principles and spirit of the disclosure, the scope of which is defined by the appended claims.

The invention claimed is:

1. A method comprising:
providing a storage memory having an array of memory cells, wherein a data word is stored in a plurality of memory cells connected to a same word line with each memory cell connected to a different bit line;
connecting a buffer to the storage memory;
connecting a processing array device to the buffer, the processing array device comprising a plurality of memory cells arranged in an array having a plurality of columns and a plurality of rows, each memory cell having a storage element wherein the array has a plurality of sections and each section has a plurality of bit line sections and a plurality of bit line pairs with one bit line pair per bit line section, each bit line pair comprising a read bit line and a write bit line, wherein the memory cells in each bit line section are all connected to a single bit line pair to perform a computation using a data word; and
communicating the data word between the processing array device, the buffer and the storage memory, wherein the processing array device stores the data word in memory cells connected to the single bit line pair and different word lines in a particular section of the processing array device or connected to a same relative bit line pair and different word lines in a plurality of sections of the processing array device.

2. The method of claim 1, wherein communicating the data word between the processing array device, the buffer and the storage memory further comprises orthogonally transposing, using a transposer, the data word transferred between the storage memory, the buffer and the processing array and wherein the transfer of the data word between the storage memory, the buffer and the processing array device is performed in three steps.

3. The method of claim 2, wherein communicating the data word between the processing array device, the buffer and the storage memory further comprises transferring, for a transfer from the storage memory to the processing array device, the data word from the storage memory to the transposer, transferring the data word from the transposer to the buffer and transferring the data from the buffer to the processing array device.

4. The method of claim 2, wherein communicating the data word between the processing array device, buffer and the storage memory further comprises transferring, for a transfer from the processing array device to the storage memory, the data word from the processing array device to the buffer, transferring the data word from the buffer to the transposer and transferring the data word from the transposer to the storage memory.

5. The method of claim 2, wherein orthogonally transposing the data word further comprises shifting the data word from being stored along the same word line in the storage memory to the data word being stored along the same bit line pair in the processing array device.

6. The method of claim 1 further comprising enabling a particular transposer selected from one or more transposers for a particular storage memory having a particular data word width.

7. The method of claim 3, wherein transferring the data word from the storage memory to the transposer further comprises storing a sixty four bit unit of data in column 63, rows 63:0 in the transposer, simultaneously column shifting sixty four bit units of data from columns 1:63 of the transposer to columns 0:62 of the transposer, and simultaneously discarding the sixty four bit unit of data in column 0, rows 63:0 of the transposer until all of the columns of the transposer store data from the storage memory.

8. The method of claim 7, wherein transferring the data word from the transposer to the buffer further comprises outputting a sixty four bit unit of data from row 0, columns 63:0 of the transposer to a 64 bit data bus connecting the buffer and the transposer, simultaneously row shifting rows 1:63 of the transposer to rows 0:62 of the transposer and simultaneously storing the sixty four bit unit of data in row 0, columns 63:0 in row 63, columns 63:0 in the transposer until the rows of the transposer are transferred to the buffer.

9. The method of claim 8, wherein transferring the data word from the buffer to the processing array device further comprises transferring, row by row, the n bit units of data from the buffer to the processing array device, where n is the number of bit line pairs in each section of the processing array.

10. The method of claim 3, wherein transferring the data word from processing array device to the buffer further comprises transferring, row by row, n bit units of data from the processing array device to the buffer, where n is the number of bit line pairs in each section of the processing array.

11. The method of claim 10, wherein transferring the data word from the buffer to the transposer further comprises storing a sixty four bit unit of data in row 63, columns 63:0 of the transposer, simultaneously row shifting sixty four bit units of data from rows 1:63 in the transposer to rows 0:62 in the transposer and simultaneously discarding a sixty four bit unit of data word stored at row 0, columns 63:0 of the transposer until the rows of the transposer store the data from the processing array device.

12. The method of claim 11, wherein transferring the data word from the transposer to the storage memory further comprises outputting a sixty four bit unit of data stored at column 0, rows 63:0 of the transposer to a 64 bit data bus connecting the storage memory and the transposer, simultaneously column shifting sixty four bit units of data stored in columns 1:63 of the transposer to columns 0:62 of the transposer and simultaneously storing a logic "0" in column 63 of the transposer until the columns of the transposer have been transferred to the storage memory.

13. The method of 2, wherein orthogonally transposing the data word further comprises orthogonally transposing a thirty two bit unit of data.

14. The method of claim 13, wherein transferring the unit of data from the storage memory to the transposer further comprises storing the thirty two bit unit of data from a first portion of a 64 bit data bus in column 63, rows 31:0 of the transposer, simultaneously storing a second thirty two bit unit of data from a second portion of the 64 bit data bus in column 62, rows 31:0 of the transposer, simultaneously column shifting the thirty two bit units of data stored in a first set of columns in the transposer to a second set of columns in the transposer, simultaneously column shifting the thirty two bit units of data stored in a third set of columns to a fourth set of columns in the transposer and simultaneously discarding the thirty two bit units of data stored in column 1, rows 31:0 and column 0, rows 31:0 of the transposer until the columns of the transposer are loaded with data from the storage memory.

15. The method of claim 14, wherein transferring the unit of data from the transposer to the buffer further comprises outputting a sixty four bit unit of data from row 0, columns 63:0 of the transposer to a 64 bit data bus connecting the buffer and the transposer, simultaneously row shifting sixty four bit units of data from rows 1:31 of the transposer to rows 0:30 of the transposer and simultaneously storing the sixty four bit unit of data stored in row 0, columns 63:0 of the transposer in row 31, columns 63:0 in the transposer until the data in the rows of the transposer are transferred to the buffer.

16. The method of claim 15, wherein transferring the unit of data from the buffer to the processing array device further comprises transferring, row by row, the n bit units of data from the buffer to the processing array device, where n is the number of bit line pairs in each section of the processing array.

17. The method of claim 3, wherein orthogonally transposing the unit of data further comprises orthogonally transposing a thirty two bit unit of data.

18. The method of claim 17, wherein transferring the unit of data from the processing array device to the buffer further comprises transferring, row by row, n bit unit of data from the processing array device to the buffer, where n is the number of bit line pairs in each section of the processing array.

19. The method of claim 18, wherein transferring the unit of data from the buffer to the transposer further comprises storing a sixty four bit unit of data from a 64 bit data bus in row 31, columns 63:0 of the transposer, simultaneously row shifting sixty four bit units of data in rows 1:31 of the transposer to rows 0:30 of the transposer and simultaneously discarding the sixty four bit unit of data stored in row 0, columns 63:0 of the transposer until the rows of the transposer are loaded with data from the processing array device.

20. The method of claim 19, wherein transferring the unit of data from the transposer to the storage memory further comprises outputting two thirty two bit units of data stored at column 0, rows 31:0 and column 1, rows 31:0 of the transposer to a 64 bit data bus connecting the storage memory and the transposer, simultaneously column shifting two thirty two bit units of data stored in a first set of columns and a second set of columns in the transposer to a third and fourth set of columns, respectively, in the transposer and simultaneously storing a logic "0" in column 63, rows 31:0 and column 62, rows 31:0 of the transposer until the columns of the transposer have been transferred to the storage memory.

21. The method of 2 wherein orthogonally transposing the unit of data further comprises orthogonally transposing a sixteen bit data word.

22. The method of claim 21, wherein transferring the unit of data from the storage memory to the transposer further comprises storing four sixteen bit units of data from a 64 bit data bus at column 63, rows 15:0, column 62, rows 15:0, column 61, rows 15:0 and column 60, rows 15:0, respectively, in the transposer, simultaneously column shifting four sixteen bit units of data in a first, second, third and fourth set of columns, respectively, in the transposer to a first shifted set, a second shifted set, a third shifted set and a fourth shifted set of columns, respectively, in the transposer and simultaneously discarding sixteen bit units of data stored in column 3, rows 15:0, column 2, rows 15:0, column 1, rows 15:0 and column 0, rows 15:0 of the transposer until the columns of the transposer are loaded with data units from the storage memory.

23. The method of claim 22, wherein transferring the unit of data from the transposer to the buffer further comprises outputting a sixty four bit unit of data stored at row 0, columns 63:0 of the transposer to a 64 bit data bus connecting the buffer and the transposer, simultaneously row shifting sixty four bit units of data stored in rows 1:15 of the transposer to row 0:14 of the transposer and simultaneously storing a sixty four bit unit of data previously stored in row 0, columns 63:0 into row 15, columns 63:0 of the transposer until the units of data in the rows of the transposer are transferred to the buffer.

24. The method of claim 23, wherein transferring the unit of data from the buffer to the processing array device further comprises transferring, row by row, the n bit units of data stored in the buffer into the processing array device, where n is the number of bit line pairs in each section of the processing array.

25. The method of 4, wherein orthogonally transposing the unit of data further comprises orthogonally transposing a sixteen bit unit of data.

26. The method of claim 25, wherein transferring the unit of data from the processing array device to the buffer further comprises transferring, row by row, n bit units of data stored in the processing array device into the buffer, where n is the number of bit line pairs in each section of the processing array.

27. The method of claim 26, wherein transferring the unit of data from the buffer to the transposer further comprises storing a sixty four bit unit of data from a 64 bit data bus in row 15, columns 63:0 of the transposer, simultaneously row shifting sixty four bit units of data in rows 1:15 to rows 0:14 of the transposer and simultaneously discarding a sixty four bit unit of data at row 0, columns 63:0 of the transposer until the rows of the transposer are loaded with data from the buffer.

28. The method of claim 27, wherein transferring the unit of data from the transposer to the storage memory further comprises outputting four sixteen bit units of data stored at column 3, rows 15:0, column 2, rows 15:0, column 1, rows 15:0 and column 0, rows 15:0 of the transposer to a 64 bit data bus connecting the storage memory and the transposer, simultaneously column shifting four sixteen bit units of data stored in a first, second, third and fourth set of columns, respectively, in the transposer to first shifted, a second shifted, a third shifted and a fourth shifted set of columns, respectively, in the transposer and simultaneously storing a logic "0" in column 63, rows 15:0, column 62, rows 15:0, column 61, rows 15:0 and column 60, rows 15:0 of the transposer until the columns of the transposer have been transferred to the storage memory.

29. The method of 2, wherein orthogonally transposing the data word further comprises orthogonally transposing an eight bit unit of data.

30. The method of claim 29, wherein transferring the data word from the storage memory to the transposer further comprises storing eight 8 bit units of data from a 64 bit data bus in column 63, rows 7:0, column 62, rows 7:0, column 61, rows 7:0, column 60, rows 7:0, column 59, rows 7:0, column 58, rows 7:0, column 57, rows 7:0 and column 56, rows 7:0, respectively, of the transposer, simultaneously column shifting eight 8 bit units of data from a first set, a second set, a third set, a fourth set, a fifth set, a sixth set, a seventh set and an eighth set of columns, respectively, to a first shifted set, a second shifted set, a third shifted set, a fourth shifted set, a fifth shifted set, a sixth shifted set, a seventh shifted set and an eighth shifted set of columns in the transposer and simultaneously discarding eight 8 bit units of data in column 7, rows 7:0, column 6, rows 7:0, column 5, rows 7:0, column 4, rows 7:0, column 3, rows 7:0, column 2, rows 7:0, column 1, rows 7:0 and column 0, rows 7:0 of the transposer until the columns in the transposer are loaded with units of data from storage memory.

31. The method of claim 30, wherein transferring the unit of data from the transposer to the buffer further comprises outputting a sixty four bit unit of data stored at row 0, columns 63:0 of the transposer to a 64 bit data bus connecting the buffer and the transposer, simultaneously row shifting sixty four bit units of data stored in rows 1:7 of the transposer to row 0:6 of the transposer and simultaneously storing a sixty four bit unit of data previously stored in row 0, columns 63:0 into row 7, columns 63:0 of the transposer until the units of data in the rows of the transposer are transferred to the buffer.

32. The method of claim 31, wherein transferring the unit of data from the buffer to the processing array device further comprises transferring, row by row, n bit units of data stored in the buffer into the processing array device, where n is the number of bit line pairs in each section of the processing array.

33. The method of 4, wherein orthogonally transposing the data word further comprises orthogonally transposing an eight bit unit of data.

34. The method of claim 33, wherein transferring the unit of data from the processing array device to the buffer further comprises transferring, row by row, n bit units of data stored in the processing array device into the buffer, where n is the number of bit line pairs in each section of the processing array.

35. The method of claim 34, wherein transferring the unit of data from the buffer to the transposer further comprises storing a sixty four bit unit of data from a 64 bit data bus in row 7, columns 63:0 of the transposer, simultaneously row shifting sixty four bit units of data in rows 1:7 to rows 0:6 of the transposer and simultaneously discarding a sixty four bit unit of data at row 0, columns 63:0 of the transposer until the rows of the transposer are loaded with data from the buffer.

36. The method of claim 35, wherein transferring the unit of data from the transposer to the storage memory further comprises outputting eight eight-bit units of data stored at column 7, rows 7:0, column 6, rows 7:0, column 5, rows 7:0, column 4, rows 7:0, column 3, rows 7:0, column 2, rows 7:0, column 1, rows 7:0, column 0, rows 7:0 of the transposer to a 64 bit data bus connecting the storage memory and the transposer, simultaneously column shifting eight eight-bit units of data stored in a first set, a second set, a third set, a fourth set, a fifth set, a sixth set, a seventh set and an eighth set of columns, respectively, in the transposer to a first shifted set, a second shifted set, a third shifted set, a fourth shifted set, a fifth shifted set, a sixth shifted set, a seventh shifted set and an eighth shifted set of columns in the transposer and simultaneously storing a logic "0" in column 63, rows 7:0, column 62, rows 7:0, column 61, rows 7:0, column 60, rows 7:0, column 59, rows 7:0, column 58, rows 7:0, column 57, rows 7:0 and column 56, rows 7:0 of the transposer until the columns of the transposer have been transferred to the storage memory.

* * * * *